United States Patent
Mizoguchi et al.

(10) Patent No.: US 9,465,307 B2
(45) Date of Patent: Oct. 11, 2016

(54) CLEANING METHOD FOR EUV LIGHT GENERATION APPARATUS

(71) Applicant: GIGAPHOTON INC., Tochigi (JP)

(72) Inventors: Hakaru Mizoguchi, Tochigi (JP); Shinji Nagai, Tochigi (JP)

(73) Assignee: GIGAPHOTON INC., Tochigi (JP)

( * ) Notice: Subject to any disclaimer, the term of this patent is extended or adjusted under 35 U.S.C. 154(b) by 545 days.

(21) Appl. No.: 13/907,818

(22) Filed: May 31, 2013

(65) Prior Publication Data

US 2013/0319466 A1    Dec. 5, 2013

(30) Foreign Application Priority Data

May 31, 2012  (JP) ................................ 2012-124629

(51) Int. Cl.
*G03F 7/20*        (2006.01)

(52) U.S. Cl.
CPC .................................. *G03F 7/70925* (2013.01)

(58) Field of Classification Search
CPC ........... G03F 7/70925; G03F 7/70033; B08B 7/0035
USPC .................................................. 134/1, 18, 21
See application file for complete search history.

(56) References Cited

U.S. PATENT DOCUMENTS

| | | | |
|---|---|---|---|
| 7,405,416 B2 | 7/2008 | Algots et al. | |
| 2003/0096193 A1* | 5/2003 | Van Schaik | G03F 7/70883 430/296 |
| 2004/0007246 A1* | 1/2004 | Chan | B08B 7/0057 134/1.1 |
| 2004/0108473 A1* | 6/2004 | Melnychuk | B82Y 10/00 250/504 R |
| 2009/0057567 A1* | 3/2009 | Bykanov | G03F 7/70033 250/429 |
| 2009/0154642 A1 | 6/2009 | Bykanov et al. | |
| 2010/0192973 A1* | 8/2010 | Ueno | B08B 7/0042 134/1.1 |
| 2011/0048452 A1* | 3/2011 | Zink | B08B 7/00 134/1 |
| 2012/0119116 A1* | 5/2012 | Kakizaki | G03F 7/70033 250/504 R |

FOREIGN PATENT DOCUMENTS

| | | | |
|---|---|---|---|
| JP | 2010-538456 A | 12/2010 | |
| JP | WO 201014721 A1 * | 12/2010 | ......... G03F 7/70033 |
| JP | 2011-023712 A | 2/2011 | |

OTHER PUBLICATIONS

An Office Action; "Notification of Reasons for Refusal" issued by the Japanese Patent Office on Mar. 8, 2016, which corresponds to Japanese Patent Application No. 2012-124629 and is related to U.S. Appl. No. 13/907,808; with English language translation.

\* cited by examiner

*Primary Examiner* — Michael Kornakov
*Assistant Examiner* — Katelyn Whatley
(74) *Attorney, Agent, or Firm* — Studebaker & Brackett PC

(57) ABSTRACT

A cleaning method for an EUV light generation apparatus may include closing a connection portion so that a chamber interior and the interior of an exposure apparatus do not communicate when EUV light is not being generated, supplying an etchant gas for etching debris that has accumulated on a reflective surface of an optical element to the chamber interior in a state where the connection portion is closed, and exhausting the chamber interior using an exhaust apparatus while supplying the etchant gas.

6 Claims, 19 Drawing Sheets

FIG.10
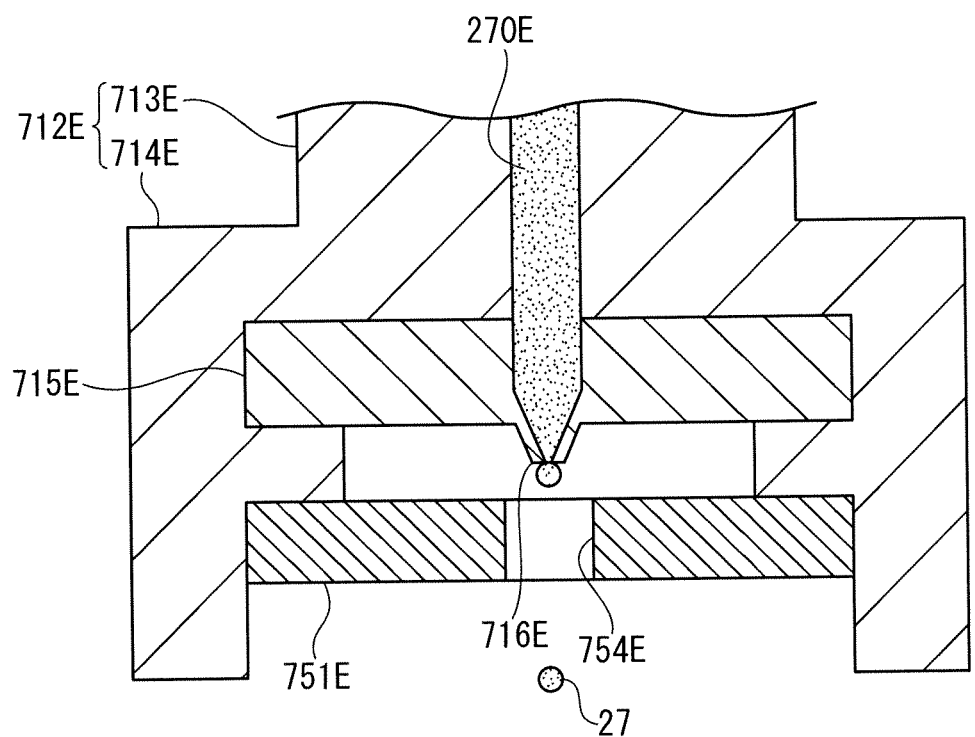
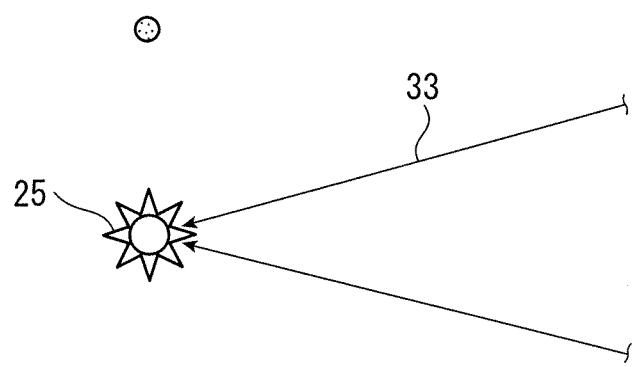

CLEANING METHOD FOR EUV LIGHT GENERATION APPARATUS

CROSS-REFERENCE TO RELATED APPLICATION

The present application claims priority from Japanese Patent Application No. 2012-124629 filed May 31, 2012.

BACKGROUND

1. Technical Field

The present disclosure relates to cleaning methods for extreme ultraviolet (EUV) light generation apparatuses.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm, and further, microfabrication with feature sizes of 32 nm or less will be required. In order to meet the demand for microfabrication with feature sizes of 32 nm or less, for example, an exposure apparatus is needed in which a system for generating EUV light at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

A cleaning method for an EUV light generation apparatus according to an aspect of the present disclosure may be a cleaning method for an EUV light generation apparatus including a chamber, a connection portion, a target supply apparatus, an optical element, and an exhaust apparatus. In the chamber, EUV light may be generated by introducing a laser beam. The connection portion may be configured to allow the interior of the chamber and the interior of an exposure apparatus to communicate. The target supply apparatus may be configured to supply a target to a plasma generation site in the chamber interior. The optical element may have a reflective surface that reflects EUV light generated by irradiating the target material with the laser beam at the plasma generation site. The exhaust apparatus may be configured to exhaust the chamber interior. The cleaning method may include closing the connection portion so that the chamber interior and the interior of the exposure apparatus do not communicate when the EUV light is not being generated, supplying an etchant gas for etching debris that has accumulated on the reflective surface of the optical element to the chamber interior in a state where the connection portion is closed, and exhausting the chamber interior using the exhaust apparatus while supplying the etchant gas.

BRIEF DESCRIPTION OF THE DRAWINGS

Hereinafter, selected embodiments of the present disclosure will be described with reference to the accompanying drawings.

FIG. 10 schematically illustrates generation of EUV light.

DETAILED DESCRIPTION

Figure 1:
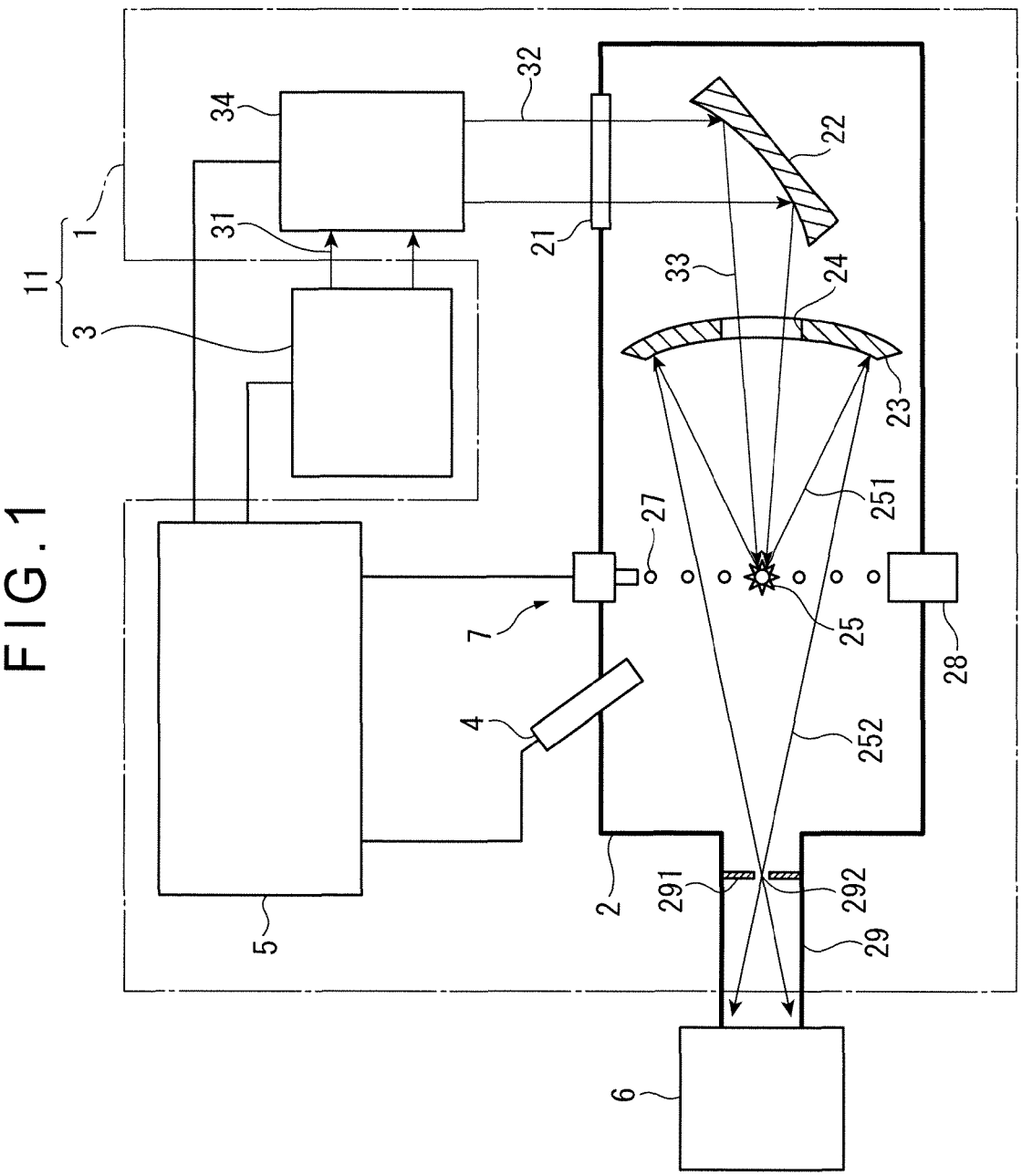
FIG. 1 illustrates the overall configuration of an exemplary LPP-type EUV light generation apparatus.

Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein.

CONTENTS

1. Overview
2. Overall Description of EUV Light Generation Apparatus
2.1 Configuration
2.2 Operation
3. EUV Light Generation Apparatus Including Cleaning Function
3.1 First Embodiment
3.1.1 Overview 3.1.2 Configuration
3.1.3 Operation
3.2 Second Embodiment
3.2.1 Overview
3.2.2 Configuration
3.2.3 Operation
3.3 Third Embodiment
3.3.1 Overview
3.3.2 Configuration
3.3.3 Operation
3.4 Fourth Embodiment
3.4.1 Overview
3.4.2 Configuration
3.4.3 Operation
3.5 Fifth Embodiment
3.5.1 Overview
3.5.2 Configuration
3.5.3 Operation
3.6 Sixth Embodiment
3.6.1 Overview
3.6.2 Configuration
3.6.3 Operation
3.7 Seventh Embodiment
3.7.1 Overview
3.7.2 Configuration
3.7.3 Operation
3.8 Eighth Embodiment
3.8.1 Overview
3.8.2 Configuration
3.8.3 Operation
3.9 Ninth Embodiment
3.9.1 Overview
3.9.2 Configuration
3.9.3 Operation 1. Overview According to an embodiment of the present disclosure, cleaning an EUV light generation apparatus may include closing a connection portion so that a chamber interior and the interior of an exposure apparatus do not communicate when EUV light is not being generated, supplying an etchant gas for etching debris that has accumulated on a reflective surface of an optical element to the chamber interior in a state where the connection portion is closed, and exhausting the chamber interior using an exhaust apparatus while supplying the etchant gas.

"Debris" produced in an EUV light generation apparatus may refer primarily to fast ions having a high level of energy, dispersed particles such as neutral particles, and the like. Such debris can adhere to the reflective surface of the optical element, and sputtering a multilayer film formed on that reflective surface can bring about a drop in the reflectance, a drop in the uniformity of the reflectance, and so on. In the case where the optical element is an EUV collector mirror, if the EUV collector mirror degrades in the stated manner, it can become difficult, in an exposure apparatus that uses the resulting EUV light, to achieve an optical energy, optical quality, and so on at a level required by semiconductor exposure processes and the like.

Here, in the case where an etchant gas is supplied to a chamber interior and debris that has accumulated on the EUV collector mirror is removed while EUV light is being generated, the EUV light can be absorbed by the etchant gas and a problem in which suitable EUV light is not outputted to the exposure apparatus can occur as a result.

According to the embodiment of the present disclosure, the etchant gas is supplied to the chamber interior and the debris is etched when EUV light is not being generated, and thus the EUV light can be suppressed from being absorbed by the etchant gas, and a problem in which suitable EUV light is not outputted to the exposure apparatus can be suppressed as a result.

Meanwhile, the chamber interior may be exhausted using the exhaust apparatus while supplying the etchant gas to the chamber interior while the connection portion between the chamber interior and the exposure apparatus interior is closed. Through such a configuration, etchant gas, reactive products produced by etching, and so on can be suppressed from mixing in the exposure apparatus, and etching can be carried out without limitations from the exposure apparatus. Accordingly, etchant gas for high-speed etching can be used, and thus the cleaning time can be reduced.

Note that the optical element to be etched is not limited to an EUV collector mirror, and in the case where a mirror that reflects EUV light is present within the chamber, this mirror may be etched as well. Alternatively, windows used in viewing ports such as various types of observation windows, laser beam introduction windows in the case where a laser beam is introduced, and so on may be etched as well.

2. Overview of EUV Light Generation Apparatus 2.1 Configuration

FIG. 1 schematically illustrates an exemplary configuration of an LPP type EUV light generation Apparatus 1. The EUV light generation apparatus 1 may be used with at least one laser apparatus 3. Hereinafter, a system that includes the EUV light generation apparatus 1 and the laser apparatus 3 may be referred to as an EUV light generation system 11. As shown in FIG. 1 and described in detail below, the EUV light generation apparatus 1 may include a chamber 2 and a target supply device 7. The chamber 2 may be sealed airtight. The target supply device 7 may be mounted onto the chamber 2, for example, to penetrate a wall of the chamber 2. A target material to be supplied by the target supply device 7 may include, but is not limited to, tin, terbium, gadolinium, lithium, xenon, or any combination thereof.

The chamber 2 may have at least one through-hole or opening formed in its wall, and a pulse laser beam 32 may travel through the through-hole/opening into the chamber 2. Alternatively, the chamber 2 may have a window 21, through which the pulse laser beam 32 may travel into the chamber 2. An EUV collector mirror 23 having a spheroidal surface may, for example, be provided in the chamber 2. The EUV collector mirror 23 may have a multi-layered reflective film formed on the spheroidal surface thereof. The reflective film may include a molybdenum layer and a silicon layer, which are alternately laminated. The EUV collector mirror 23 may have a first focus and a second focus, and may be positioned such that the first focus lies in a plasma generation region 25 and the second focus lies in an intermediate focus (IF) region 292 defined by the specifications of an external apparatus, such as an exposure apparatus 6. The EUV collector mirror 23 may have a through-hole 24 formed at the center thereof so that a pulse laser beam 33 may travel through the through-hole 24 toward the plasma generation region 25.

The EUV light generation apparatus 1 may further include an EUV light generation controller 5 and a target sensor 4.

The target sensor 4 may have an imaging function and detect at least one of the presence, trajectory, position, and speed of a target 27.

Further, the EUV light generation apparatus 1 may include a connection part 29 for allowing the interior of the chamber 2 to be in communication with the interior of the exposure apparatus 6. A wall 291 having an aperture 293 may be provided in the connection part 29. The wall 291 may be positioned such that the second focus of the EUV collector mirror 23 lies in the aperture 293 formed in the wall 291.

The EUV light generation apparatus 1 may also include a laser beam direction control unit 34, a laser beam focusing mirror 22, and a target collector 28 for collecting targets 27. The laser beam direction control unit 34 may include an optical element (not separately shown) for defining the direction into which the pulse laser beam 32 travels and an actuator (not separately shown) for adjusting the position and the orientation or posture of the optical element.

2.2 Operation

With continued reference to FIG. 1, a pulse laser beam 31 outputted from the laser apparatus 3 may pass through the laser beam direction control unit 34 and be outputted therefrom as the pulse laser beam 32 after having its direction optionally adjusted. The pulse laser beam 32 may travel through the window 21 and enter the chamber 2. The pulse laser beam 32 may travel inside the chamber 2 along at least one beam path from the laser apparatus 3, be reflected by the laser beam focusing mirror 22, and strike at least one target 27 as a pulse laser beam 33.

The target supply device 7 may be configured to output the target(s) 27 toward the plasma generation region 25 in the chamber 2. The target 27 may be irradiated with at least one pulse of the pulse laser beam 33. Upon being irradiated with the pulse laser beam 33, the target 27 may be turned into plasma, and rays of light 251 including EUV light may be emitted from the plasma. At least the EUV light included in the light 251 may be reflected selectively by the EUV collector mirror 23. EUV light 252, which is the light reflected by the EUV collector mirror 23, may travel through the intermediate focus region 292 and be outputted to the exposure apparatus 6. Here, the target 27 may be irradiated with multiple pulses included in the pulse laser beam 33.

The EUV light generation controller 5 may be configured to integrally control the EUV light generation system 11. The EUV light generation controller 5 may be configured to process image data of the target 27 captured by the target sensor 4. Further, the EUV light generation controller 5 may be configured to control at least one of: the timing when the target 27 is outputted and the direction into which the target 27 is outputted. Furthermore, the EUV light generation controller 5 may be configured to control at least one of: the timing when the laser apparatus 3 oscillates, the direction in which the pulse laser beam 33 travels, and the position at which the pulse laser beam 33 is focused. It will be appreciated that the various controls mentioned above are merely examples, and other controls may be added as necessary.

3. EUV Light Generation Apparatus Including Cleaning Function

3.1 First Embodiment

3.1.1 Overview

According to a first embodiment of the present disclosure, measuring an amount of debris that has accumulated on a reflective surface of an optical element during generation of EUV light may be performed, and in the case where it has been determined that the amount of accumulated debris is greater than or equal to a threshold, stopping the generation of EUV light and closing a connection portion, supplying an etchant gas into a chamber interior, and exhausting the chamber interior may be performed.

According to the cleaning method for the EUV light generation apparatus in the first embodiment, the debris is etched in the case where the amount of debris that has accumulated on the reflective surface of the optical element is greater than or equal to the threshold, and thus wasteful processing, such as performing etching when no debris has accumulated or when the amount of accumulated debris is low and etching is unnecessary, can be suppressed.

3.1.2 Configuration

Figure 2:
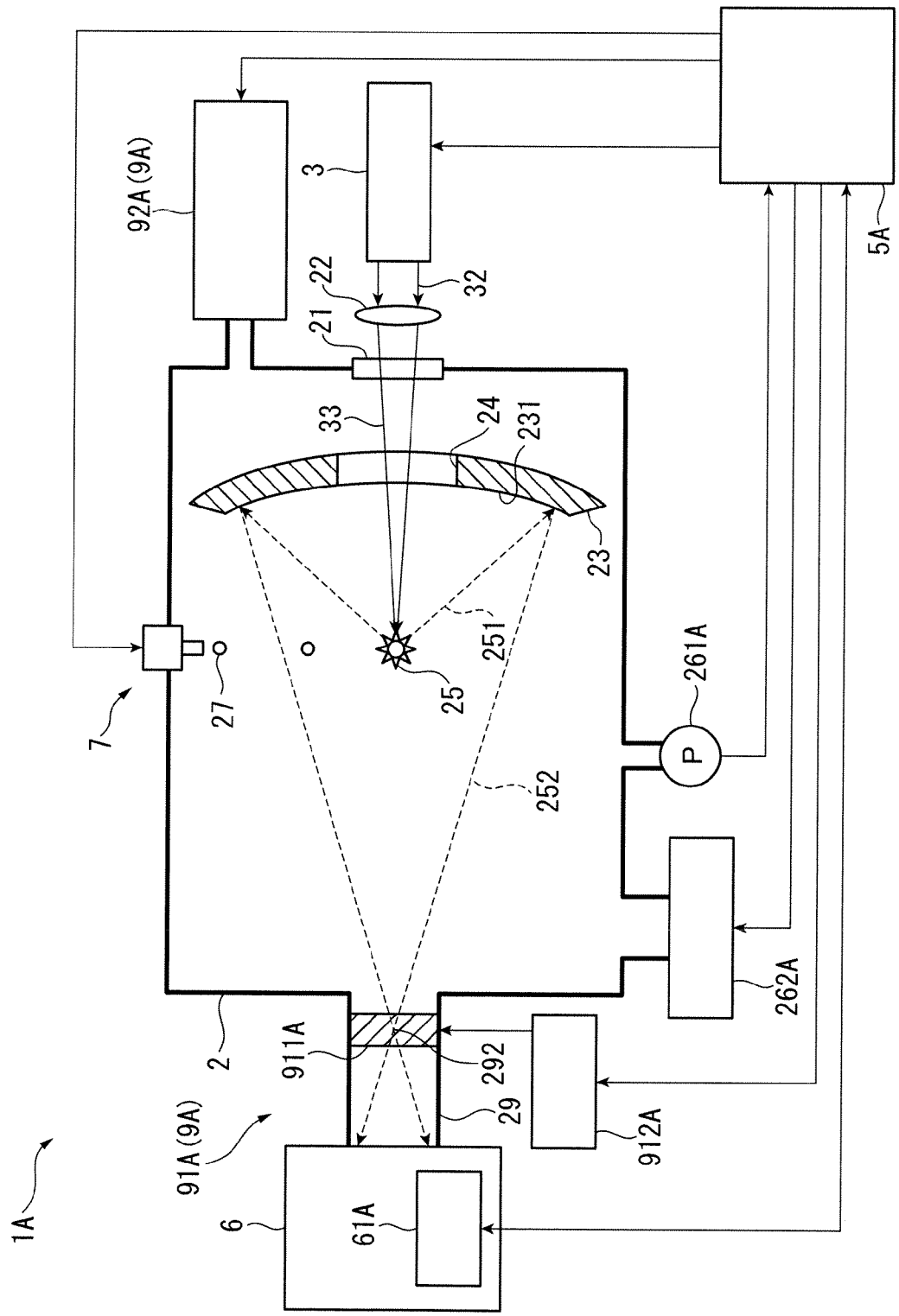
FIG. 2 illustrates the overall configuration of an EUV light generation apparatus including a cleaning function according to a first embodiment.

FIG. 2 illustrates the overall configuration of an EUV light generation apparatus including a cleaning function according to the first embodiment.

An EUV light generation apparatus 1A may, as shown in FIG. 2, include a chamber 2, a laser apparatus 3, an EUV light generation control system 5A, an exposure apparatus 6, a target supply apparatus 7, and a cleaning section 9A.

A pressure sensor 261A that detects a pressure within the chamber 2 and an exhaust apparatus 262A that exhausts the interior of the chamber 2 may be provided in the chamber 2. The pressure sensor 261A and the exhaust apparatus 262A may be electrically connected to the EUV light generation control system 5A. The pressure sensor 261A may send a signal indicating the pressure within the chamber 2 to the EUV light generation control system 5A. The exhaust apparatus 262A may exhaust the interior of the chamber 2 based on a signal sent from the EUV light generation control system 5A.

An exposure apparatus controller 61A that controls the exposure apparatus 6 as a whole may be provided in the exposure apparatus 6. The exposure apparatus controller 61A may be electrically connected to the EUV light generation control system 5A. The exposure apparatus controller 61A may control operations of the exposure apparatus 6 based on a signal from the EUV light generation control system 5A.

The cleaning section 9A may include a communication control section 91A that controls a state of communication between the interior of the chamber 2 and the interior of the exposure apparatus 6, and an etchant gas supply section 92A that supplies an etchant gas to the interior of the chamber 2.

The communication control section 91A may include a valve 911A and a valve driving unit 912A. The valve 911A may be provided within a connection portion 29 in the same position as a wall 291, shown in FIG. 1. The valve 911A may be provided so as to be switchable between an open state that forms an aperture through which EUV light 252 passes in the connection portion 29 (that is, in which the interior of the chamber 2 and the interior of the exposure apparatus 6 communicate) and a closed state in which the interior of the chamber 2 and the interior of the exposure apparatus 6 do not communicate. The valve 911A may be electrically connected to the valve driving unit 912A.

The valve driving unit 912A may be electrically connected to the EUV light generation control system 5A. The valve driving unit 912A may switch the valve 911A to the open state or the closed state based on a signal sent from the EUV light generation control system 5A.

The etchant gas supply section 92A may be provided in the chamber 2. The etchant gas supply section 92A may be electrically connected to the EUV light generation control system 5A. The etchant gas supply section 92A may supply an etchant gas to the interior of the chamber 2 based on a signal sent from the EUV light generation control system 5A.

Here, the etchant gas supplied by the etchant gas supply section 92A may be any gas capable of etching a target material, which is the primary constituent material of the debris, and may be selected as appropriate based on the target material. For example, the etchant gas may be hydrogen radicals or a halogen gas. The etchant gas may be a radicalized gas or a non-radicalized gas.

In the case where the etchant gas is hydrogen radicals, a hydrogen gas may be introduced into the chamber 2 through a hydrogen radical generator. In the case where the etchant gas is a halogen gas, $Cl_2$ gas, HCl gas, $Br_2$ gas, HBr gas, or the like may be introduced into the chamber 2.

In the case where tin is used as the target material, reactive products resulting from etching using the etchant gas can be produced. The melting points and boiling points of the reactive products may be as indicated in Table 1.

TABLE 1

| Reactive Product | Melting Point | Boiling Point |
| --- | --- | --- |
| $SnH_4$ | −146° C. | −52° C. |
| $SnCl_4$ | −33° C. | 114° C. |
| $SnBr_4$ | 31° C. | 202° C. |
| $SnI_4$ | 143° C. | 364° C. |
| $SnF_4$ | — | 700° C. |

As shown in Table 1, in the case where a hydrogen radical is used as the etchant gas, $SnH_4$ can remain in a gaseous state at normal temperatures, and thus can quickly be etched away from a reflective surface 231 of an EUV collector mirror 23. In the case where $Cl_2$, $Br_2$, or the like is used as the etchant gas, $SnCl_4$, $SnBr_4$, or the like remains liquid at normal temperatures. However, $SnCl_4$, $SnBr_4$, or the like can be evaporated from the reflective surface 231 of the EUV collector mirror 23 by putting the interior of the chamber 2 into a vacuum state.

Meanwhile, in the case where a halogen gas is used as the etchant gas, the speeds of the reactions indicated below are faster than when hydrogen gas is used, and thus the etching can be finished in a shorter amount of time than when using hydrogen gas.

Hydrogen Radical

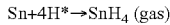
Sn+4H*→$SnH_4$ (gas)

Halogen Gas

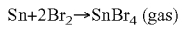
Sn+2$Br_2$→$SnBr_4$ (gas)

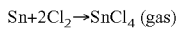
Sn+2$Cl_2$→$SnCl_4$ (gas)

3.1.3 Operation

Next, operations of the EUV light generation apparatus will be described.

Figure 3:
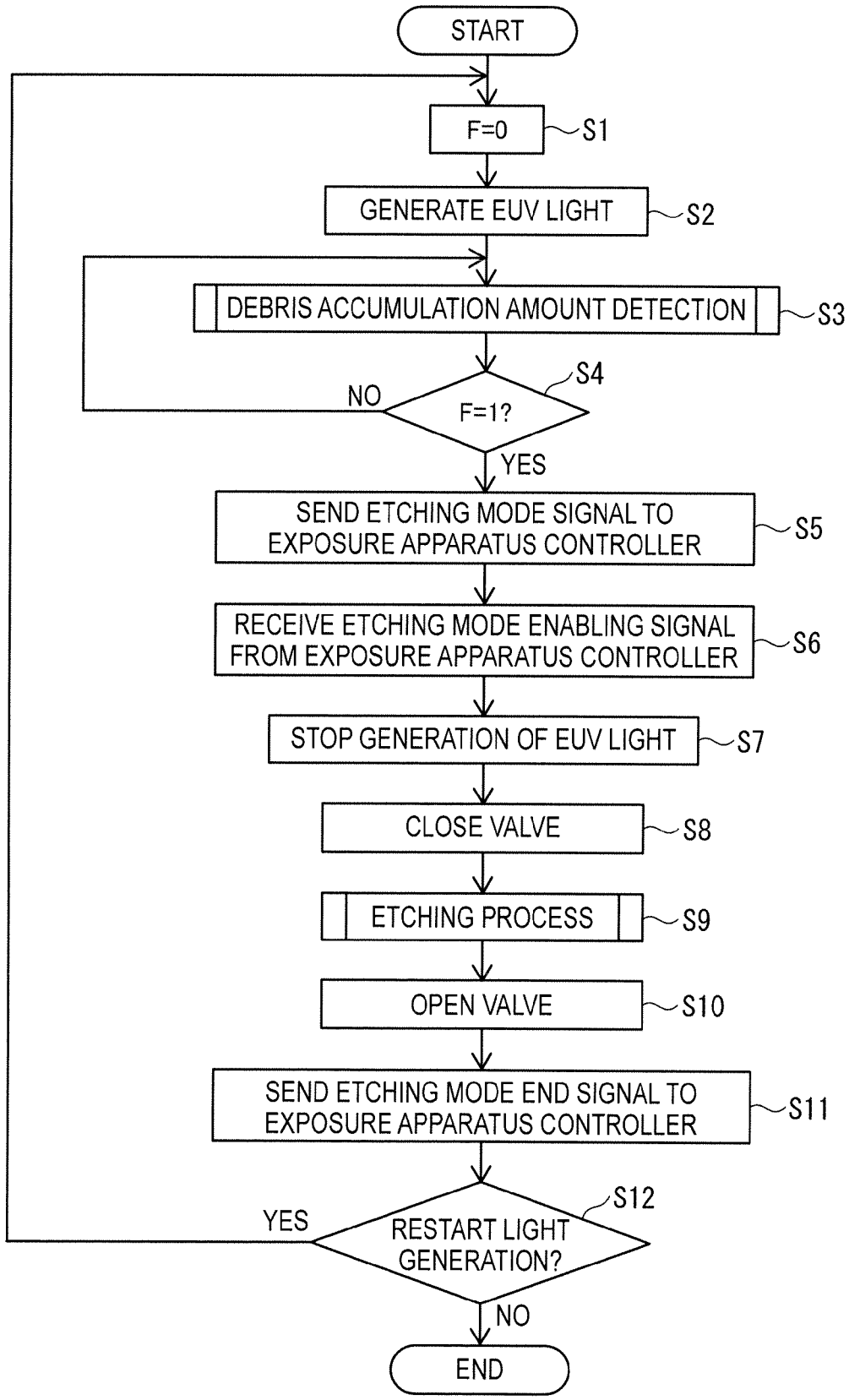
FIG. 3 is a flowchart illustrating an EUV light generation process in the EUV light generation apparatus.
Figure 4:
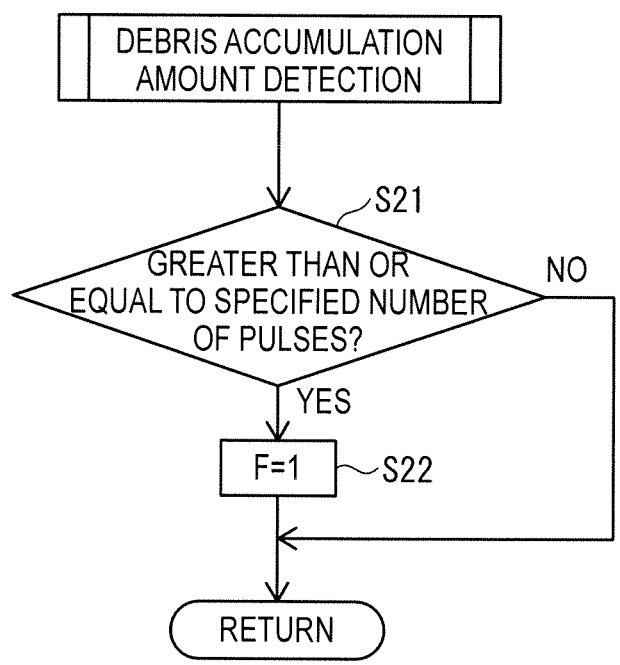
FIG. 4 is a flowchart illustrating a debris accumulation amount detection process.
Figure 5:
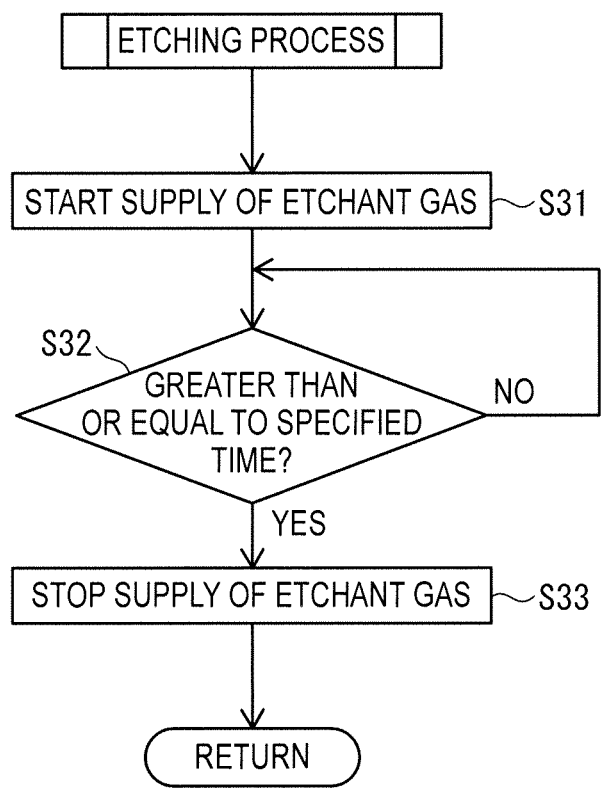
FIG. 5 is a flowchart illustrating an etching process.

FIG. 3 is a flowchart illustrating an EUV light generation process in the EUV light generation apparatus. FIG. 4 is a flowchart illustrating a debris accumulation amount detection process. FIG. 5 is a flowchart illustrating an etching process.

In the case where a signal indicating that EUV light 251 is to be generated has been received, the EUV light generation control system 5A of the EUV light generation apparatus 1A may set a variable F to "0", as indicated in FIG. 3 (step S1). After this, the EUV light generation control system 5A may generate the EUV light 251 (step S2).

In step S2, for example, in the case where the valve 911A is in the open state, the EUV light generation control system 5A may send, to the exhaust apparatus 262A, a signal indicating that the interior of the chamber 2 is to be exhausted to a pressure at which the EUV light 251 can be generated. The exhaust apparatus 262A may exhaust the interior of the chamber 2 upon receiving the signal sent from the EUV light generation control system 5A. The pressure within the chamber 2 can drop due to the exhausting performed by the exhaust apparatus 262A. The pressure sensor 261A may send a signal indicating the pressure within the chamber 2 to the EUV light generation control system 5A. The EUV light generation control system 5A may detect the pressure within the chamber 2 based on the signal from the pressure sensor 261A and control the exhaust apparatus 262A based on the detected pressure.

Meanwhile, the EUV light generation control system 5A may cause the exposure apparatus 6 to operate by sending a signal for causing the exposure apparatus 6 to operate to the exposure apparatus controller 61A.

Furthermore, in the case where it has been determined that the pressure within the chamber 2 has reached a pressure at which the EUV light 251 can be generated based on the signal from the pressure sensor 261A, the EUV light generation control system 5A may send a signal for outputting a droplet 27 to the laser apparatus 3 and may send a signal for outputting a pulse laser beam 31 to the laser apparatus 3. As a result of this operation, the droplet 27 can be irradiated with a pulse laser beam 33 at a plasma generation site 25, and the EUV light 251 can be generated as a result.

After this, the EUV light generation control system 5A may detect an amount of debris that has accumulated on the reflective surface 231 of the EUV collector mirror 23 (step S3).

Specifically, the EUV light generation control system 5A may determine whether or not the number of discharge pulses of the laser apparatus 3 following an etching process (mentioned later) is greater than or equal to a specified number of pulses, as indicated in FIG. 4 (step S21). For example, in the case where an accumulation rate of the debris is taken as D (nm/pls (pulse)) and an accumulation amount (film thickness) threshold is taken as T (nm), the specified number of pulses may be defined as T/D (pls). It is favorable for the debris accumulation rate D (nm/pls (pulse)) and the accumulation amount threshold T (nm) to be determined through experimentation or the like.

In the case where it has been determined in step S21 that the number of pulses is greater than or equal to the specified number of pulses, the EUV light generation control system 5A may set the variable F to "1" (step S22) and end the processing of step S3. On the other hand, in the case where it has been determined in step S21 that the number of pulses is not greater than or equal to the specified number of pulses, the EUV light generation control system 5A may end the processing of step S3.

Through this processing, the variable F can be set to "1" in the case where it has been determined that the number of discharge pulses is greater than or equal to the specified number of pulses and the debris accumulation amount is greater than or equal to the threshold. On the other hand, the variable F can be set to "0" in the case where it has been determined that the number of discharge pulses is less than the specified number of pulses and the debris accumulation amount is less than the threshold.

After the processing of step S3, the EUV light generation control system 5A may determine whether or not the variable F is set to "1", as shown in FIG. 3 (step S4). In the case where it has been determined in step S4 that the variable F is set to "0", the EUV light generation control system 5A may detect the debris accumulation amount by once again performing the processing of step S3. On the other hand, in the case where it has been determined in step S4 that the variable F is set to "1", the EUV light generation control system 5A may send an etching mode signal, for requesting the start of debris etching, to the exposure apparatus controller 61A (step S5).

Having received the etching mode signal, the exposure apparatus controller 61A may stop exposure operations performed by the exposure apparatus 6. Thereafter, the exposure apparatus controller 61A may send an etching mode enabling signal to the EUV light generation control system 5A.

Upon receiving the etching mode enabling signal from the exposure apparatus controller 61A (step S6), the EUV light generation control system 5A may stop the generation of the EUV light 251 by controlling the laser apparatus 3 and the target supply apparatus 7 (step S7). Then, the EUV light generation control system 5A may close the valve 911A by sending a signal for placing the valve 911A in the closed state to the valve driving unit 912A (step S8).

Thereafter, the EUV light generation control system 5A may perform an etching process (step S9).

In the etching process, the EUV light generation control system 5A may start the supply of the etchant gas to the interior of the chamber 2 by sending a signal to the etchant gas supply section 92A, as indicated in FIG. 5 (step S31). At this time, the EUV light generation control system 5A may exhaust the interior of the chamber 2 using the exhaust apparatus 262A while supplying the etchant gas. For example, in the case where the target material is tin and the etchant gas is hydrogen, $SnH_4$ can be generated as the reactive product accompanying the debris removal. This $SnH_4$ can remain gaseous at normal temperatures as described above, and thus can be exhausted to the exterior of the chamber 2 using the exhaust apparatus 262A.

Then, the EUV light generation control system 5A may determine whether or not a time for which the etchant gas is supplied has become greater than or equal to a specified time (step S32). In the case where an etching rate is taken as E (nm/min) and an accumulation amount threshold is taken as Tc (nm), the specified time may be defined as Tc/E (min). It is favorable for the etching rate E (nm/min) and the accumulation amount threshold Tc (nm) to be determined through experimentation or the like.

In the case where it has been determined in step S32 that the time is greater than or equal to the specified time, or in other words, in the case where it has been determined that the debris etching is to be ended, the EUV light generation control system 5A may stop the supply of the etchant gas (step S33) by sending a signal to the etchant gas supply section 92A, and may then end the processing of step S9. At this time, the EUV light generation control system 5A may stand by for a set amount of time while performing the exhaust operations so that the etchant gas and the reactive product are sufficiently exhausted from the interior of the chamber 2. Furthermore, the EUV light generation control system 5A may stand by while exhausting the interior of the chamber 2 until a pressure at which the EUV light 251 can be generated is reached. Through this processing, the debris that has accumulated on the reflective surface 231 of the EUV collector mirror 23 can be reduced to less than or equal to a predetermined amount, and the reactive product can be exhausted from the interior of the chamber 2.

On the other hand, in the case where it has been determined in step S32 that the time is not greater than or equal to the specified time, the EUV light generation control system 5A may once again carry out the process of step S32 after a pre-set amount of time has elapsed.

After the processing of step S9 has ended, the EUV light generation control system 5A may open the valve 911A by sending a signal for putting the valve 911A into the open state to the valve driving unit 912A, as shown in FIG. 3 (step S10). In this state, an aperture through which the EUV light 252 passes is formed in the connection portion 29. The EUV light generation control system 5A may then send an etching mode end signal indicating that the etching has ended to the exposure apparatus controller 61A (step S11). Having received the etching mode end signal, the exposure apparatus controller 61A may, in the case where exposure operations are to be restarted, send an exposure restart signal to the EUV light generation control system 5A. On the other hand, the exposure apparatus controller 61A may, in the case where exposure operations are to be ended, send an exposure end signal to the EUV light generation control system 5A.

Next, the EUV light generation control system 5A may determine whether or not the generation of EUV light is to be restarted (step S12). In step S12, in the case where the exposure restart signal has been received from the exposure apparatus controller 61A, the EUV light generation control system 5A may determine to restart the light generation. In this case, the processing of step S1 may be performed. On the other hand, in the case where the exposure end signal has been received from the exposure apparatus controller 61A, the EUV light generation control system 5A may determine not to restart the light generation. In this case, the EUV light generation process may end.

As described above, the EUV light generation control system 5A may enable debris to be etched by supplying an etchant gas to the interior of the chamber 2 when EUV light 251 is not being generated. Through such a configuration, the EUV light 251 can be suppressed from being absorbed by the etchant gas, and a problem in which suitable EUV light 251 is not outputted to the exposure apparatus 6 can be suppressed as a result.

In addition, in a state where the connection portion 29 is closed by the valve 911A, the interior of the chamber 2 is exhausted by the exhaust apparatus 262A while the etchant gas is supplied to the interior of the chamber 2, and thus the etchant gas, reactive products, and so on can be suppressed from mixing in the exposure apparatus 6. By using etchant gas for high-speed etching, the cleaning time can be reduced.

Upon determining that the debris accumulation amount is greater than or equal to the threshold, the EUV light generation control system 5A may stop the generation of the EUV light 251 and etch the debris using the etchant gas. Through such a configuration, wasteful processing, such as performing etching when no debris has accumulated or when the amount of accumulated debris is low and etching is unnecessary, can be suppressed.

3.2 Second Embodiment

3.2.1 Overview

According to a second embodiment of the present disclosure, hydrogen radicals may be used as the etchant gas.

According to such a configuration, it can be possible to improve the etching rate compared to a case where a halogen gas is used as the etchant gas.

3.2.2 Configuration

Figure 6:
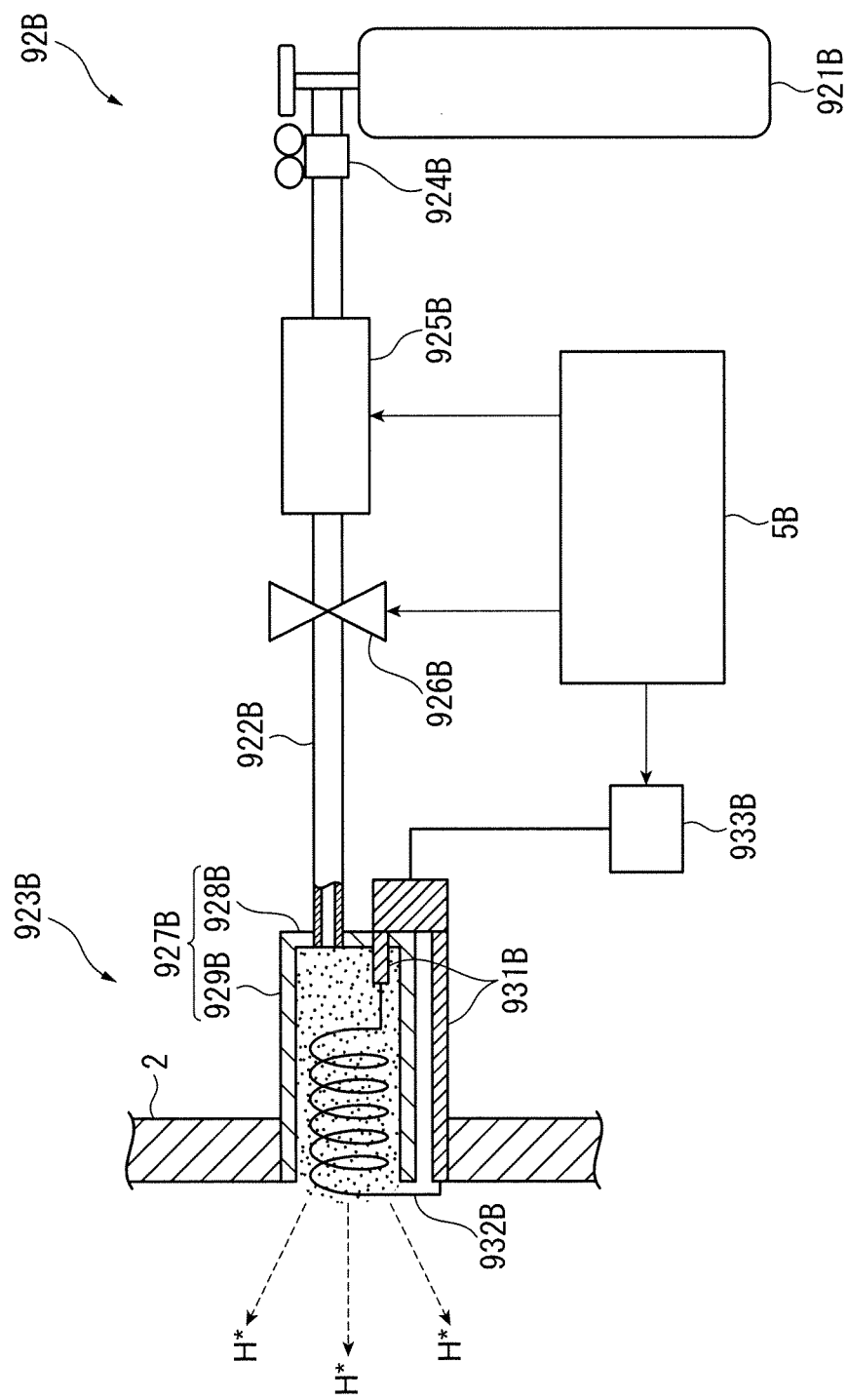
FIG. 6 illustrates the overall configuration of an etchant gas supply section according to a second embodiment.

FIG. 6 illustrates the overall configuration of an etchant gas supply section according to the second embodiment.

The same configurations as those in the EUV light generation apparatus 1A of the first embodiment may be applied in an EUV light generation apparatus (not shown) according to the second embodiment, aside from an EUV light generation control system 5B and an etchant gas supply section 92B.

As shown in FIG. 6, the etchant gas supply section 92B may include a hydrogen tank 921B, a hydrogen gas supply pipe 922B, and a hydrogen radical generation section 923B.

The hydrogen gas supply pipe 922B may communicate with the hydrogen tank 921B and the hydrogen radical generation section 923B. The hydrogen gas supply pipe 922B may be provided with a regulator 924B, a mass flow controller 925B, and a valve 926B.

The regulator 924B may supply hydrogen gas to the hydrogen gas supply pipe 922B by reducing the pressure from the inner pressure of the hydrogen tank 921B.

The mass flow controller 925B and the valve 926B may be electrically connected to the EUV light generation control system 5B. The mass flow controller 925B may adjust a flow amount of the hydrogen gas based on a signal from the EUV light generation control system 5B. The valve 926B may be configured to be capable of switching between an open state in which the hydrogen gas can be supplied from the hydrogen tank 921B to the hydrogen radical generation section 923B and a closed state in which the hydrogen gas cannot be supplied based on a signal from the EUV light generation control system 5B.

The hydrogen radical generation section 923B may include a hydrogen radical generator 927B, a pair of electrodes 931B, a filament 932B, and a hydrogen radical generator power source 933B.

The hydrogen radical generator 927B may include a plate-shaped base portion 928B and a side wall portion 929B that extends from an outer edge of the base portion 928B in a direction orthogonal to the base portion 928B, and may be formed in a cylindrical shape in which a surface facing the base portion 928B is open. The hydrogen radical generator 927B may be attached to the chamber 2 so that the interior of the hydrogen radical generator 927B and the interior of the chamber 2 communicate. The hydrogen gas supply pipe 922B may be attached to the base portion 928B so that the interior of the hydrogen gas supply pipe 922B and the interior of the hydrogen radical generator 927B communicate.

One electrode 931B of the pair of electrodes 931B may be provided so as to extend from the base portion 928B in a direction orthogonal to the base portion 928B within the hydrogen radical generator 927B. The other electrode 931B may be provided parallel to the one electrode 931B on the outside of the hydrogen radical generator 927B.

The filament 932B may be formed of tungsten or the like. The filament 932B may be electrically connected to the tips of the pair of electrodes 931B.

The hydrogen radical generator power source 933B may be electrically connected to the EUV light generation control system 5B. The hydrogen radical generator power source 933B may be configured so as to produce a current in the filament 932B by applying a voltage to the pair of electrodes 931B based on a signal from the EUV light generation control system 5B.

3.2.3 Operation

Next, operations of the EUV light generation apparatus according to the second embodiment will be described.

Note that the operations of the EUV light generation apparatus according to the second embodiment that differ from the operations in the above first embodiment may be the operations performed in the etchant gas supply start process of step S31 and the etchant gas supply stop process of step S33. The other processes may be the same as those described in the first embodiment. Accordingly, only the processes of step S31 and step S33 will be described here.

In step S31, the EUV light generation control system 5B of the EUV light generation apparatus may send a signal, indicating the start of the supply of the etchant gas, to the mass flow controller 925B, the valve 926B, and the hydrogen radical generator power source 933B. Having received the signal, the mass flow controller 925B and the valve 926B may supply the hydrogen gas, whose flow amount has been adjusted, to the interior of the hydrogen radical generator 927B via the hydrogen gas supply pipe 922B. Meanwhile, having received the signal, the hydrogen radical generator power source 933B may produce a predetermined current in the filament 932B by applying a voltage to the pair of electrodes 931B.

When the predetermined current is produced in the filament 932B, the filament 932B can be heated to a temperature being greater than or equal to 1700° C. and less than or equal to 2000° C. When the hydrogen gas is supplied to the hydrogen radical generator 927B in this state, hydrogen radicals can be generated by hydrogen molecules colliding with the filament 932B and resulting in thermal decomposition. The hydrogen radicals can be then supplied to the interior of the chamber 2 as the etchant gas. Compared to hydrogen molecules, hydrogen radicals are highly reactive, and thus an improvement in the etching rate can be expected.

On the other hand, in step S33, the EUV light generation control system 5B may send a signal, indicating the stop of the supply, to the mass flow controller 925B, the valve 926B, and the hydrogen radical generator power source 933B. Having received this signal, the hydrogen radical generator power source 933B may stop applying the voltage to the pair of electrodes 931B. In addition, having received the signal, the mass flow controller 925B and the valve 926B may stop the supply of hydrogen gas to the interior of the chamber 2. The supply of the etchant gas can be stopped through the above processing.

As described above, using hydrogen radicals as the etchant gas can make it possible to improve the etching rate.

3.3 Third Embodiment

3.3.1 Overview

According to a third embodiment of the present disclosure, the etchant gas supply section may include a hydrogen radical generation section that generates hydrogen radicals outside of the chamber, and a transport pipe that is provided extending from the chamber exterior to the chamber interior and that transports the hydrogen radicals generated by the hydrogen radical generation section.

According to such a configuration, even in the case where it is not possible to dispose the hydrogen radical generation section in the vicinity of the EUV collector mirror (optical element) to be etched due to the size of the hydrogen radical generation section being large or the like, it can be possible for the hydrogen radicals to be transported to the vicinity of the EUV collector mirror using a simple method of simply adjusting the shape of the transport pipe. Accordingly, it is possible to suppress hydrogen radical deactivation, and thus a drop in the etching performance can be suppressed.

3.3.2 Configuration

Figure 7:
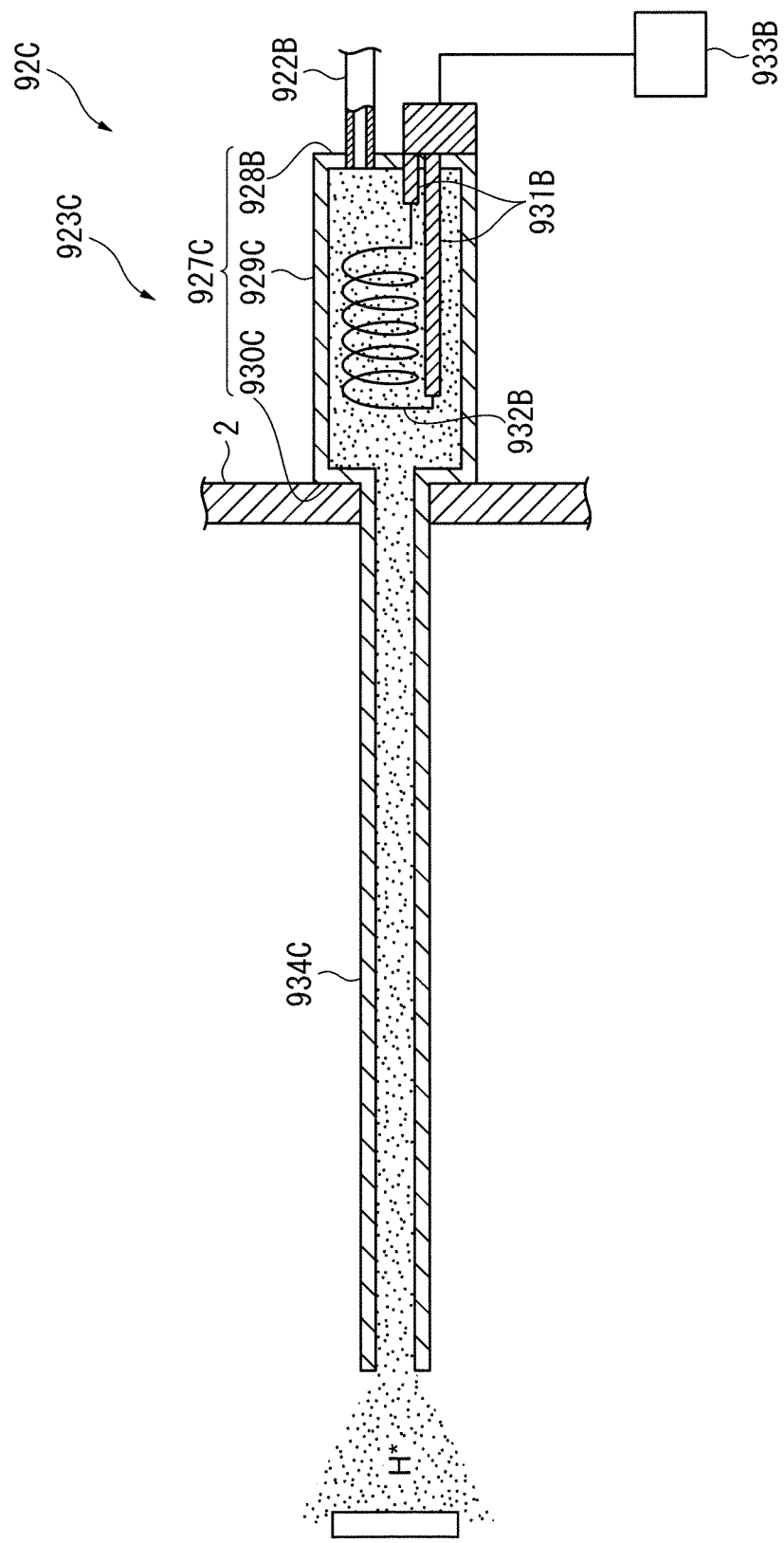
FIG. 7 illustrates the overall configuration of an etchant gas supply section according to a third embodiment.

FIG. 7 illustrates the overall configuration of an etchant gas supply section according to the third embodiment.

The same configuration as in the EUV light generation apparatus of the second embodiment may be applied in an EUV light generation apparatus (not shown) according to the third embodiment, aside from a hydrogen radical generation section 923C.

As shown in FIG. 7, an etchant gas supply section 92C may include the hydrogen gas supply pipe 922B and the hydrogen radical generation section 923C.

The hydrogen radical generation section 923C may include a hydrogen radical generator 927C, the pair of electrodes 931B, the filament 932B, the hydrogen radical generator power source 933B, and a transport pipe 934C.

The hydrogen radical generator 927C may include the base portion 928B, a side surface portion 929C, and a cover portion 930C. The cover portion 930C may be provided so as to cover an opening portion of a cylinder shape formed by the base portion 928B and the side surface portion 929C. The hydrogen radical generator 927C may be attached to the chamber 2 so that an outer surface of the cover portion 930C makes contact with an outer surface of the chamber 2.

The transport pipe 934C may be provided so as to pass through a wall of the chamber 2. The transport pipe 934C may be provided so that one end thereof is connected to the cover portion 930C and the other end thereof is located in the vicinity of the EUV collector mirror 23 within the chamber 2, and may be configured to be capable of blowing the hydrogen radicals generated by the hydrogen radical generator 927C onto the reflective surface 231 of the EUV collector mirror 23.

Note that the hydrogen radicals can deactivate on an inner wall surface of the transport pipe 934C during transport and recombine into hydrogen molecules in the transport pipe 934C. To suppress such deactivation, at least the inner surface of the transport pipe 934C may be formed of a material having a low recombination coefficient. Here, the entire transport pipe 934C may be formed of a material having a low recombination coefficient, or only the inner wall surface of the transport pipe 934C may be coated with a material having a low recombination coefficient. $SiO_2$ may be used as the material having a low recombination coefficient.

3.3.3 Operation

Next, operations of the EUV light generation apparatus will be described.

Note that the operations of the EUV light generation apparatus according to the third embodiment may be the same as those of the second embodiment, aside from an etchant gas supply process.

During an etchant gas supply start process, the etchant gas supply section 92C may generate hydrogen radicals through the same process as the etchant gas supply section 92B of the second embodiment. The generated hydrogen radicals can be conveyed to the vicinity of the EUV collector mirror 23 via the transport pipe 934C, and can be blown upon the reflective surface 231 of the EUV collector mirror 23. By forming at least the inner wall surface of the transport pipe 934C of a material having a low recombination coefficient, the hydrogen radicals can be suppressed from deactivating during transport. As a result, the hydrogen radicals can be blown onto the reflective surface 231 as the etchant gas.

As described above, the etchant gas supply section 92C may be provided with the hydrogen radical generation section 923C that generates hydrogen radicals on the exterior of the chamber 2 and the transport pipe 934C that transports the hydrogen radicals generated by the hydrogen radical generation section 923C to the vicinity of the EUV collector mirror 23 within the chamber 2.

According to such a configuration, hydrogen radicals can be conveyed to the vicinity of the EUV collector mirror 23 using a simple method of simply adjusting the shape of the transport pipe 934C, regardless of the size of the hydrogen radical generation section 923C, the location in which the EUV collector mirror 23 is disposed, and so on. Accordingly, it is possible to suppress hydrogen radical deactivation, and thus a drop in the etching performance can be suppressed.

Although so-called filament-type hydrogen radical generation sections 923B and 923C, which use the filament 932B, are used in the second and third embodiments, respectively, hydrogen plasma may be generated by causing hydrogen gas to flow over a plasma source, and the debris may then be etched using the hydrogen plasma. Furthermore, a halogen gas may be used as the etchant gas. Because the etching performance of the halogen gas is higher than that of hydrogen gas, the halogen gas need not be radicalized in this case.

3.4 Fourth Embodiment

3.4.1 Overview

According to a fourth embodiment of the present disclosure, the exhaust apparatus may include a trap section that traps reactive products produced by etching debris and a collection section that collects the target material from the reactive products trapped by the trap section.

According to such a configuration, the etched debris can be reused as the target material, and thus an effective use of resources can be achieved.

3.4.2 Configuration

Figure 8A:
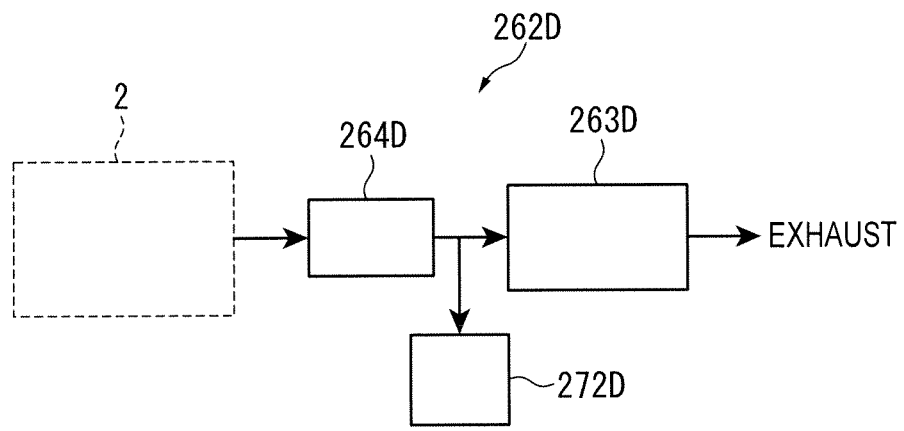
FIG. 8A schematically illustrates an exhaust apparatus according to a fourth embodiment.
Figure 8B:
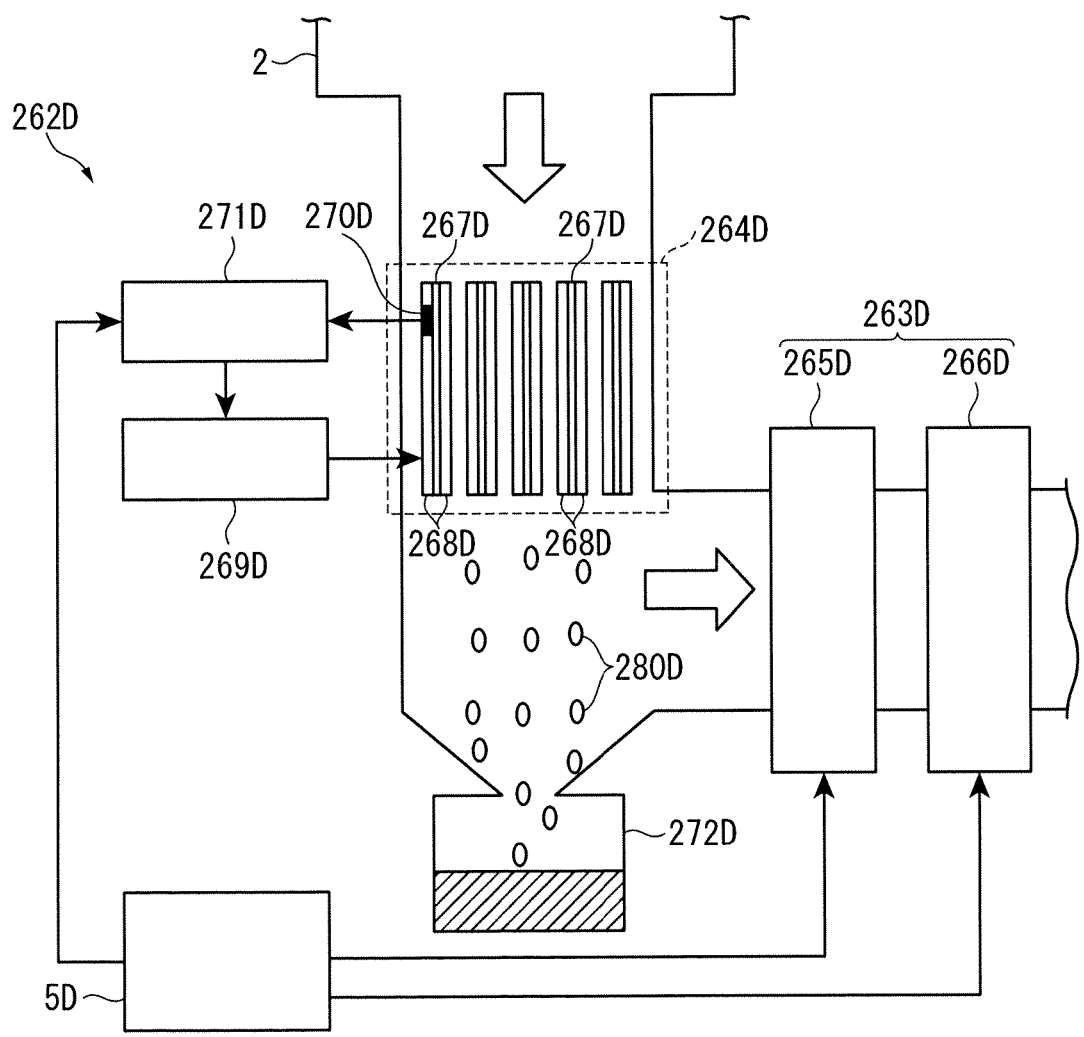
FIG. 8B schematically illustrates the configuration of the exhaust apparatus.

FIG. 8A schematically illustrates an exhaust apparatus according to the fourth embodiment. FIG. 8B schematically illustrates the configuration of the exhaust apparatus.

In the fourth embodiment, the EUV light generation apparatus according to the first to third embodiments may be provided with an exhaust apparatus 262D instead of the exhaust apparatus 262A. Accordingly, the same configurations as in the first to third embodiments may be applied in an EUV light generation apparatus (not shown) according to the fourth embodiment, aside from the exhaust apparatus 262D.

As shown in FIGS. 8A and 8B, the exhaust apparatus 262D may include a vacuum pump 263D, a trap section 264D, and a collection section 272D. A connection portion between the chamber 2 and the trap section 264D may extend in a gravitational direction. A connection portion between the trap section 264D and the vacuum pump 263D may bend in an L shape and extend in a horizontal direction. A connection portion between the trap section 264D and the collection section 272D may extend in the gravitational direction. A connection portion among the trap section 264D, the vacuum pump 263D, and the collection section 272D may have a T shape. The vacuum pump 263D may include a turbomolecular pump 265D provided on the chamber 2 side and a dry pump 266D provided on the opposite side of the chamber 2 relative to the turbomolecular pump 265D. The turbomolecular pump 265D and the dry pump 266D may be electrically connected to an EUV light generation control system 5D.

The trap section 264D may trap reactive products that flow into the vacuum pump 263D from the chamber 2. For example, in the case where the target material is tin and a gas containing hydrogen is used as the etchant gas, $SnH_4$ (stannane gas) can be produced as a reactive product. The trap section 264D may be disposed partway along the connection portion that extends from the chamber 2 in the gravitational direction. Blades 267D of the trap section 264D may be provided with a heater 268D that is heated by an electric current.

A power source 269D that supplies the electric current to the heater 268D may be connected to the heater 268D. Meanwhile, a temperature sensor 270D may be provided to at least one of the blades 267D. A signal corresponding to a temperature detected by the temperature sensor 270D may be inputted into a temperature controller 271D. The temperature controller 271D may be electrically connected to the EUV light generation control system 5D. The temperature controller 271D may control the electrical current supplied to the heater 268D from the power source 269D based on the temperature detected by the temperature sensor 270D.

Although details will be given later, the collection section 272D for collecting molten tin 280D that has flowed out from the trap section 264D may be provided in a lower section of the connection portion extending from the chamber 2 in the gravitational direction.

3.4.3 Operation

Next, operations of the EUV light generation apparatus will be described.

Note that the operations of the EUV light generation apparatus according to the fourth embodiment may be the same as those of any of the first to third embodiments, aside from an exhaust process. Accordingly, only the exhaust process of the operations according to the fourth embodiment will be described.

When generating the EUV light 251, the EUV light generation control system 5D may send a signal indicating the start of exhausting to the turbomolecular pump 265D and the dry pump 266D. Having received this signal, the turbomolecular pump 265D and the dry pump 266D may start driving and exhaust the interior of the chamber 2 via the connection portion.

Meanwhile, when stopping the generation of the EUV light 251 and performing a debris etching process, the EUV light generation control system 5D may send a signal indicating that the blades 267D of the trap section 264D are to be heated to the temperature controller 271D. In the case where the target material is tin, the temperature controller 271D may, having received the signal, control the power source 269D and heat the blades 267D to a temperature that is greater than or equal to the temperature at which tin melts (approximately 231° C.).

The reactive products exhausted from the chamber 2 by the vacuum pump 263D may advance into the trap section 264D. In the case where the reactive product is a stannane gas, the stannane gas is heated to greater than or equal to 100° C. and separates into tin and hydrogen upon advancing into the trap section 264D. The hydrogen obtained through this separation can be exhausted by the vacuum pump 263D via the connection portion between the trap section 264D and the vacuum pump 263D. On the other hand, the tin obtained through this separation can adhere to the blades 267D. At this time, the blades 267D are heated to a temperature greater than or equal to the temperature at which tin melts, and thus the tin can flow out from the trap section 264D as the molten tin 280D and can be collected in the collection section 272D.

In addition, by setting part of the connection portion between the trap section 264D and the collection section 272D that extends from the chamber 2 as a funnel shape, it is possible to collect the molten tin 280D that has flowed out from the trap section 264D in a central area of the collection section 272D. In this case, the opening of the collection section 272D can be configured having a small size, which may make it possible to suppress scattering of splashed tin when the molten tin 280D falls into the collection section 272D. Furthermore, the collection section 272D may be provided with a heater, a temperature sensor, a temperature controller, and the like, and the areas of the collection section 272D that make contact with the tin may be adjusted to a temperature greater than or equal to the melting point of tin. In this case, the tin can be collected in a receptacle having the minimum volume required to hold the collected molten tin, and thus the collection section 272D can be configured having a small size.

As described above, the exhaust apparatus 262D may trap the reactive products produced by etching the debris, and the trapped reactive products may be collected as tin, which serves as the target material.

According to such a configuration, the etched debris can be reused as the target material, and thus an effective use of resources can be achieved.

Note that the vacuum pump 263D may be configured of only the dry pump 266D. In addition, the trap section 264D may be provided further toward the exhaust side than the vacuum pump 263D. Furthermore, a hydrogen diluting apparatus may be provided on the exhaust side of the vacuum pump 263D, and the exhausted hydrogen may be suppressed from reaching an explosion limit concentration.

3.5 Fifth Embodiment

3.5.1 Overview

According to a fifth embodiment of the present disclosure, a target generator of an EUV light generation apparatus may generate droplets using what is known as an electrostatic extraction technique. This EUV light generation apparatus may then perform closing a connection portion when EUV light is not being generated so that a chamber interior and an exposure apparatus interior do not communicate, supplying an etchant gas to the interior of the chamber in a state in which the connection portion is closed, and exhausting the interior of the chamber using an exhaust apparatus while supplying the etchant gas.

In the case of an electrostatic extraction-type target generator, a voltage being greater than or equal to several tens of kV may be applied between a nozzle and an extraction electrode. The target material can be extracted from the nozzle and a droplet can be formed as a result of this voltage application. The droplet that has been formed can then be outputted into the chamber.

Here, when a high voltage (for example, greater than or equal to several tens of kV) is applied under conditions in which an etchant gas (for example, hydrogen gas) is present in an atmosphere between the nozzle and the extraction electrode, insulation breakdown can occur and the output of droplets can be suppressed.

However, according to the fifth embodiment, when EUV light is being generated, the etchant gas is not supplied and the interior of the chamber is exhausted into a vacuum state. Accordingly, insulation breakdown is suppressed from occurring between the nozzle and the extraction electrodes, and the droplets can be correctly formed. Furthermore, since it is unnecessary to generate droplets when EUV light is not being generated, it is likewise unnecessary to apply a high voltage between the nozzle and the extraction electrode, and thus the etchant gas can be supplied and tin that has accumulated on an EUV collector mirror as debris can be etched.

3.5.2 Configuration

Figure 9:
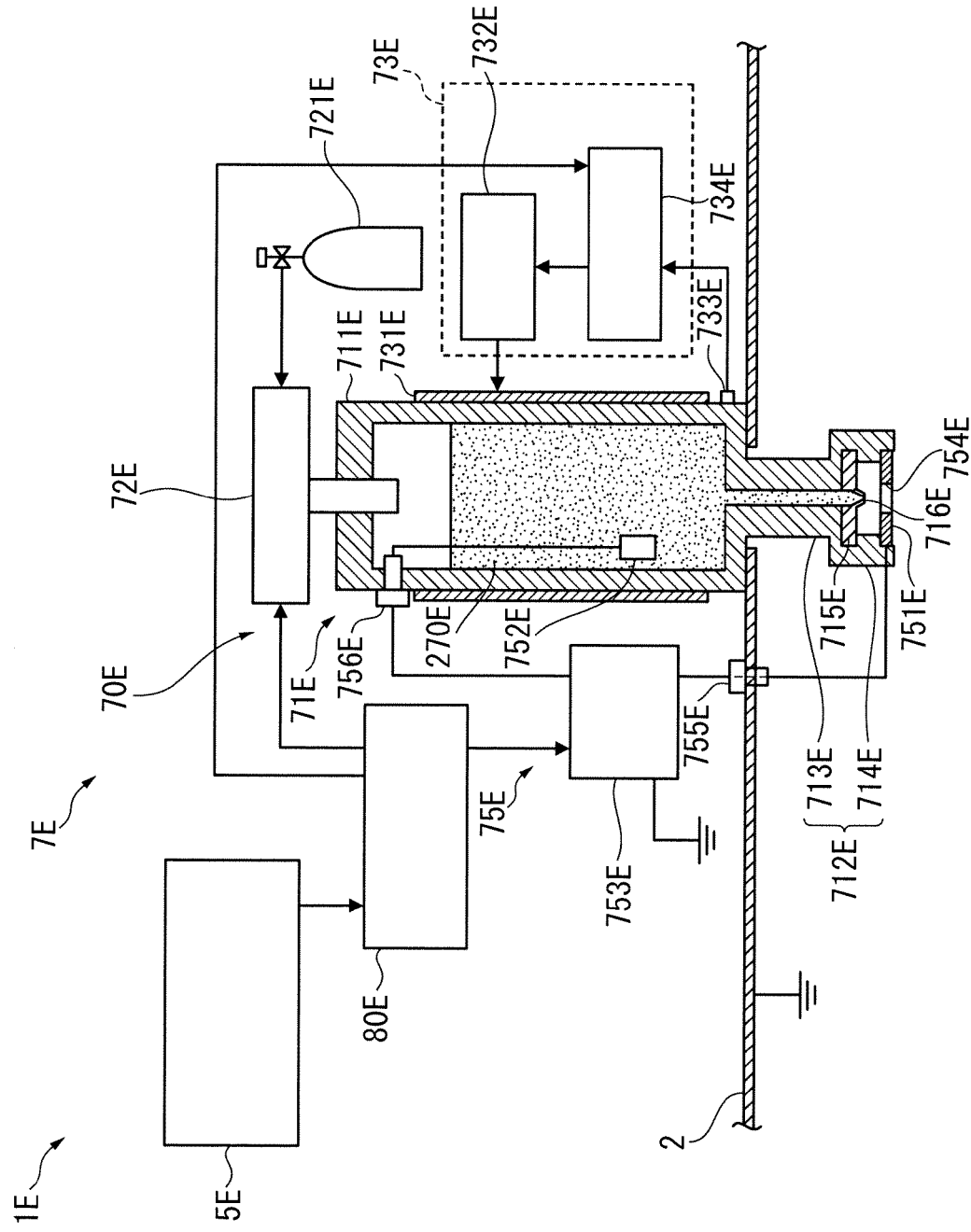
FIG. 9 illustrates the overall configuration of a target supply apparatus in an EUV light generation apparatus according to a fifth embodiment.

FIG. 9 illustrates the overall configuration of a target supply apparatus in the EUV light generation apparatus according to the fifth embodiment. FIG. 10 schematically illustrates generation of EUV light.

As shown in FIG. 9, a target supply apparatus 7E that partially configures an EUV light generation apparatus 1E may include an EUV light generation control system 5E, a target generation unit 70E, and a target control apparatus 80E. The target generation unit 70E may include a target generator 71E, a pressure adjuster 72E connected to a non-volatile gas tank 721E, a temperature adjustment unit 73E, and an electrostatic extraction unit 75E.

The target generator 71E may include a tank 711E and a nozzle 712E. The nozzle 712E may include a nozzle main body 713E, a leading end holding portion 714E, and an output portion 715E. The nozzle main body 713E may be provided so as to protrude into the chamber 2 from a lower surface of the tank 711E. The leading end holding portion 714E may be provided on the leading end of the nozzle main body 713E. The leading end holding portion 714E may be formed as a cylinder whose diameter is greater than that of the nozzle main body 713E. The leading end holding portion 714E may be configured as a separate entity from the nozzle main body 713E and may be anchored to the nozzle main body 713E.

The output portion 715E may be formed as an approximately circular plate. The output portion 715E may be held by the leading end holding portion 714E so as to be affixed to the leading end surface of the nozzle main body 713E. A circular cone-shaped protruding portion 716E that protrudes into the chamber 2 may be provided in a central area of the output portion 715E. The protruding portion 716E may be provided to make it easier for an electrical field to concentrate thereon. A nozzle hole may be provided in the protruding portion 716E, in approximately the center of a leading end portion that configures the upper surface of the circular cone in the protruding portion 716E. It is preferable for the output portion 715E to be configured of a material that has a lower wettability against a target material 270E. In an alternative case, at least the surface of the output portion 715E may be coated with a material having a low wettability.

The tank 711E, the nozzle 712E, and the output portion 715E may be configured of electrically insulated materials. In the case where these elements are configured of materials that are not electrically insulated materials, for example, metal materials such as molybdenum, an electrically insulated material may be disposed between the chamber 2 and the target generator 71E, between the output portion 715E and an extraction electrode 751E (mentioned later), and so on. In this case, the tank 711E and a pulse voltage generator 753E, mentioned later, may be electrically connected.

The temperature adjustment unit 73E may include a heater 731E, a heater power source 732E, a temperature sensor 733E, and a temperature controller 734E. The heater 731E may be provided on an outer circumferential surface of the tank 711E. The heater power source 732E may be electrically connected to the heater 731E and the temperature controller 734E. The heater power source 732E may cause the heater 731E to produce heat by supplying power to the heater 731E based on a signal from the temperature controller 734E. As a result, the target material 270E within the tank 711E can be heated.

The temperature sensor 733E may be provided on the nozzle 712E side in the outer circumferential surface of the tank 711E, or may be provided within the tank 711E. The temperature controller 734E may be electrically connected to the temperature sensor 733E. The temperature sensor 733E may be configured to detect a temperature of the target material 270E within the tank 711E and send a signal corresponding to the detected temperature to the temperature controller 734E. The temperature controller 734E may be configured to determine the temperature of the target material 270E based on the signal from the temperature sensor 733E and output a signal to the heater power source 732E for adjusting the temperature of the target material 270E to a predetermined temperature. Through this, the temperature adjustment unit 73E may keep the tank 711E at, for example, a temperature that is greater than or equal to the melting point of the target material 270E.

The electrostatic extraction unit 75E may include the extraction electrode 751E, an electrode 752E, and the pulse voltage generator 753E.

The extraction electrode 751E may be formed as an approximately circular plate. A circular through-hole 754E for allowing droplets to pass through may be formed in the center of the extraction electrode 751E. The extraction electrode 751E may be held by the leading end holding portion 714E so that a gap is formed between the extraction electrode 751E and the output portion 715E. It is preferable for the extraction electrode 751E to be held so that the center axis of the through-hole 754E and the axis of rotational symmetry of the circular cone-shaped protruding portion 716E match. The extraction electrode 751E may be electrically connected to the pulse voltage generator 753E via a feedthrough 755E.

The electrode 752E may be disposed in the target material 270E within the tank 711E. The electrode 752E may be electrically connected to the pulse voltage generator 753E via a feedthrough 756E. The pulse voltage generator 753E may be electrically connected to the target control apparatus 80E. The pulse voltage generator 753E may be configured to apply a voltage between the target material 270E within the tank 711E and the extraction electrode 751E. Through this, the target material 270E can be extracted as the droplet 27 due to electrostatic force, as shown in FIG. 10.

3.5.3 Operation

Next, operations of the EUV light generation apparatus will be described.

The operations of the EUV light generation apparatus according to the fifth embodiment may be the same as those of the first to fourth embodiments, aside from an EUV light generation process.

As described above, when EUV light is being generated, the interior of the chamber 2 may be exhausted to a vacuum state without supplying the etchant gas. Through such a configuration, insulation breakdown between the nozzle 712E and the extraction electrode 751E can be suppressed, and the droplets can be formed correctly.

Furthermore, since it is unnecessary to generate droplets when EUV light is not being generated, it is likewise unnecessary to apply a high voltage between the nozzle 712E and the extraction electrode 751E, and thus the etchant gas can be supplied and tin that has accumulated on the EUV collector mirror as debris can be etched.

3.6 Sixth Embodiment

3.6.1 Overview

According to a sixth embodiment of the present disclosure, the optical element may be an EUV collector mirror that reflects and collects EUV light, and measuring an amount of debris may measure an amount of debris in an area of a reflective surface of the EUV collector mirror that is closest to a plasma generation site.

Here, assuming that EUV light expands isotropically, the amount of debris that accumulates on the reflective surface of the EUV collector mirror can be greater in areas nearer to the plasma generation site than in areas further from the plasma generation site. In addition, when it has been determined, for example, that the accumulation amount of the debris is greater than or equal to a threshold in an area where the accumulation amount is the lowest and etching is to be started, there is a risk that, during the generation of EUV light prior to etching, the accumulation amount of the debris will greatly exceed the threshold in the area where the accumulation amount is the greatest (that is, will exceed a permissible range), and unsuitable EUV light will be outputted.

In contrast, in the sixth embodiment, the debris etching is started based on a result of a measurement in an area where the debris has accumulated the most, and thus the generation of EUV light can be stopped prior to the accumulation amount exceeding the permissible range, and a problem in which unsuitable EUV light is outputted can be prevented in advance.

3.6.2 Configuration

Figure 11:
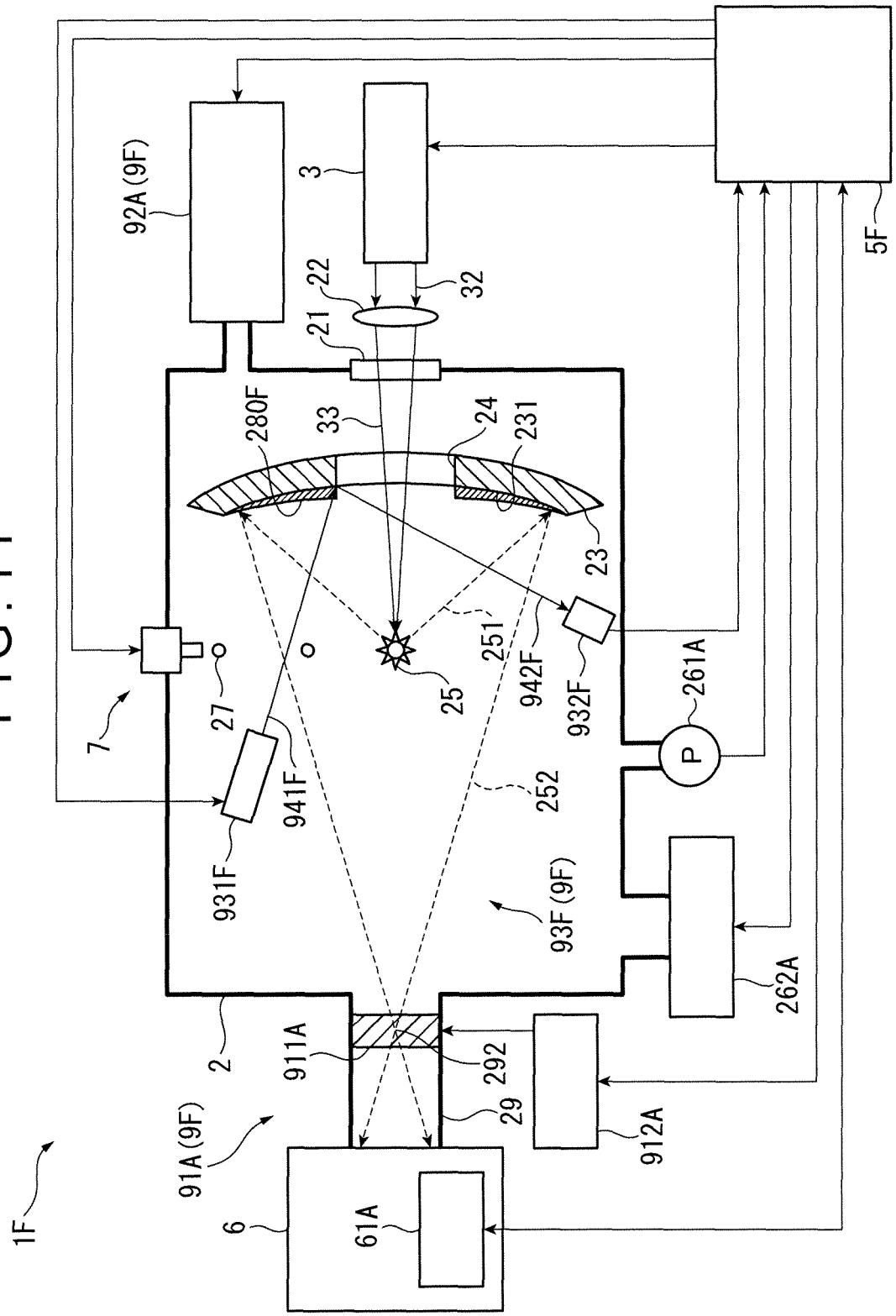
FIG. 11 illustrates the overall configuration of an EUV light generation apparatus including a cleaning function according to a sixth embodiment.

FIG. 11 illustrates the overall configuration of an EUV light generation apparatus including a cleaning function according to the sixth embodiment.

An EUV light generation apparatus 1F may, as shown in FIG. 11, have the same configuration as the EUV light generation apparatus 1A of the first embodiment, aside from an EUV light generation control system 5F and a cleaning section 9F. The cleaning section 9F may include the communication control section 91A, the etchant gas supply section 92A, and a debris sensor 93F.

The debris sensor 93F may include a light-emitting unit 931F and a light-receiving unit 932F. The light-emitting unit 931F and the light-receiving unit 932F may each be electrically connected to the EUV light generation control system 5F. Upon receiving a signal from the EUV light generation control system 5F, the light-emitting unit 931F may output probe light 941F toward a circumferential edge area of a through-hole 24 in the reflective surface 231 of the EUV collector mirror 23. The circumferential edge area of the through-hole 24 can be an area of the reflective surface 231 that is closest to the plasma generation site 25, and can have the highest accumulation amount (film thickness) of debris 280F on the reflective surface 231. The light-receiving unit 932F may receive reflected light 942F reflected by the reflective surface 231, and may send a signal corresponding to the amount of light received to the EUV light generation control system 5F.

3.6.3 Operation

Next, operations of the EUV light generation apparatus will be described.

Figure 12:
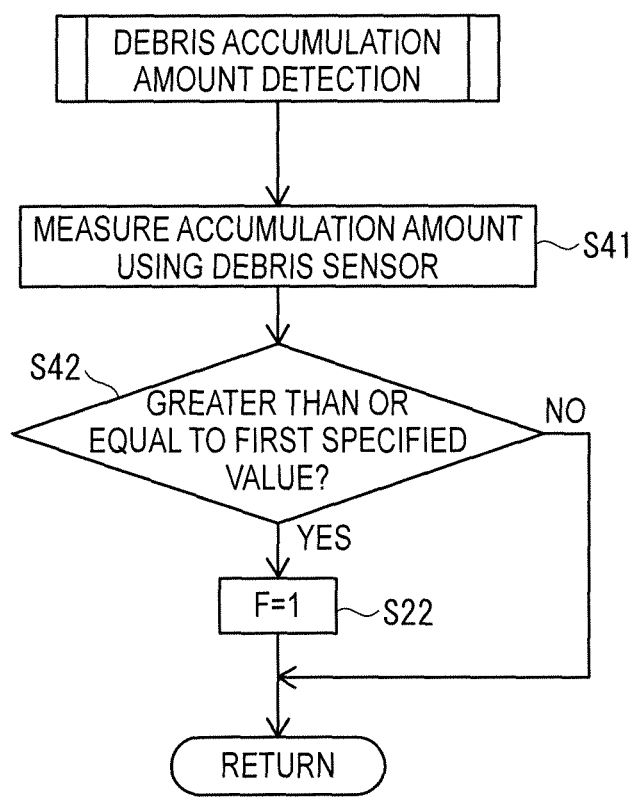
FIG. 12 is a flowchart illustrating a debris accumulation amount detection process.
Figure 13:
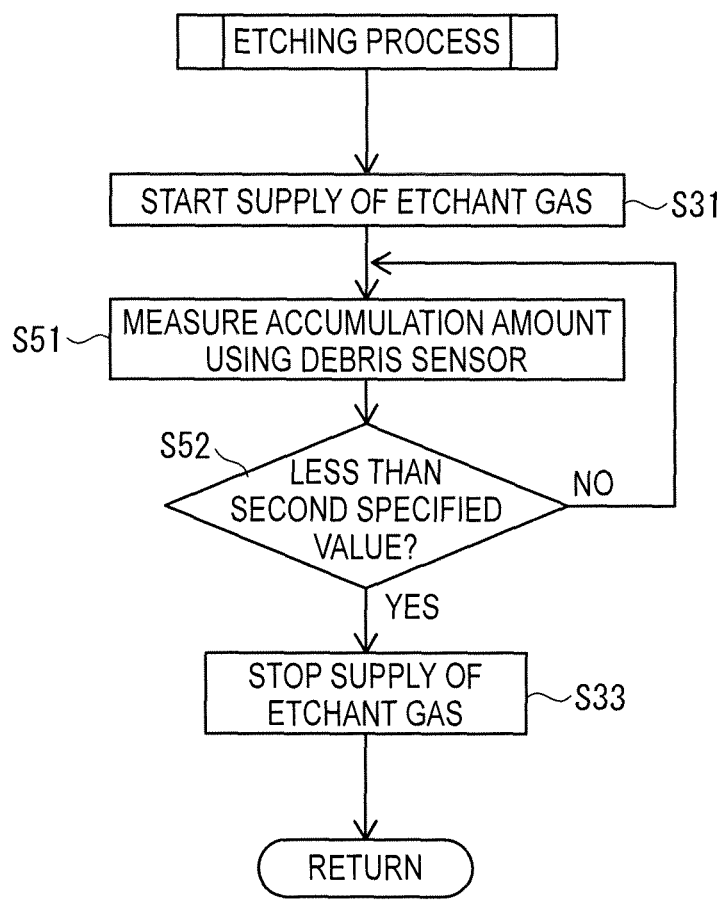
FIG. 13 is a flowchart illustrating an etching process.

FIG. 12 is a flowchart illustrating a debris accumulation amount detection process. FIG. 13 is a flowchart illustrating an etching process.

Note that the operations of the EUV light generation apparatus according to the sixth embodiment may be the same as those of the first to fifth embodiments, aside from the debris accumulation amount detection process and the etching process.

The EUV light generation control system 5F may perform the processes of step S1 to step S12 shown in FIG. 3. In the debris accumulation amount detection process of step S3, the EUV light generation control system 5F may measure an accumulation amount of the debris 280F using the debris sensor 93F, as shown in FIG. 12 (step S41). The EUV light generation control system 5F may send a signal to the light-emitting unit 931F and cause the probe light 941F to be outputted, and may receive a signal from the light-receiving unit 932F corresponding to the amount of reflected light 942F that has been received.

After this, the EUV light generation control system 5F may determine whether or not the accumulation amount of the debris 280F is greater than or equal to a first specified value (step S42). When measuring the accumulation amount of the debris 280F, for example, a correlation curve between the film thickness of the debris 280F and the amount of the reflected light 942F received by the light-receiving unit 932F may be found in advance, and the accumulation amount may be measured based on the received light amount corresponding to the signal received by the EUV light generation control system 5F and the correlation curve. Meanwhile, the first specified value may be T=0.75 (nm), when, for example, the target material is taken as tin and a permissible drop in the pre-etching EUV light reflectance is taken as 10%.

In the case where it has been determined in step S42 that the accumulation amount is greater than or equal to the first specified value, the EUV light generation control system 5F may set the variable F to "1" (step S22) and end the processing of step S3. On the other hand, in the case where it has been determined in step S42 that the accumulation amount is not greater than or equal to the first specified value, the EUV light generation control system 5F may end the processing of step S3 without performing the process of step S22.

Through such processing, the variable F can be set to "1" in the case where the accumulation amount of the debris 280F is greater than or equal to the first specified value. On the other hand, the variable F can be set to "0" in the case where the accumulation amount of the debris 280F is less than the first specified value.

Meanwhile, as shown in FIG. 13, the EUV light generation control system 5F may start the supply of the etchant gas to the interior of the chamber 2 while exhausting the interior of the chamber 2 using the exhaust apparatus 262A (step S31). Then, the EUV light generation control system 5F may measure the accumulation amount of the debris 280F using the debris sensor 93F (step S51), and may determine whether or not the accumulation amount is less than a second specified value (step S52). The second specified value may be T=0.0375 (nm), when, for example, the target material is taken as tin and a permissible drop in the post-etching EUV light reflectance is taken as 0.5%.

In the case where it has been determined in step S52 that the accumulation amount is less than the second specified value, the EUV light generation control system 5F may stop the supply of the etchant gas (step S33) by sending a signal to the etchant gas supply section 92A, and may then end the processing of step S9. Through this processing, the debris 280F that has accumulated on the reflective surface 231 can be reduced to less than or equal to a predetermined amount, and the reactive products can be exhausted from the interior of the chamber 2.

On the other hand, in the case where it has been determined in step S52 that the accumulation amount is not less than the second specified value, the EUV light generation control system 5F may once again carry out the process of step S51 after a pre-set amount of time has elapsed.

As described above, the EUV light generation control system 5F may start etching the debris 280F in the case where it has been determined that the accumulation amount of the debris 280F is greater than or equal to the first specified value in an area where the debris 280F has accumulated the most. According to such a configuration, the generation of EUV light can be stopped prior to the accumulation amount exceeding the first specified value across the entire range of the reflective surface 231, and a problem in which unsuitable EUV light is outputted can be prevented in advance.

3.7 Seventh Embodiment

3.7.1 Overview

According to a seventh embodiment of the present disclosure, an EUV light generation apparatus may include a magnetic field forming section that forms a magnetic field within the chamber interior. By forming a magnetic field during the generation of EUV light, the magnetic field forming section may trap debris including tin ions so that the debris does not adhere to the EUV collector mirror, and the debris may then be collected in an ion collection cylinder. This EUV light generation apparatus may then perform closing a connection portion when EUV light is not being generated so that a chamber interior and an exposure apparatus interior do not communicate, supplying an etchant gas to the interior of the chamber in a state in which the connection portion is closed, and exhausting the interior of the chamber using an exhaust apparatus while supplying the etchant gas.

Here, in the case where the debris including tin ions is trapped by the magnetic field under conditions in which the etchant gas is present during the generation of EUV light, the debris can collide with the etchant gas. As a result of this collision, the debris can accumulate on the EUV collector mirror without entering into the ion collection cylinder.

As opposed to this, according to the seventh embodiment, the debris may be etched using the etchant gas only when EUV light is not being generated, and may then be exhausted, whereas when the EUV light is being generated, the interior of the chamber may be exhausted to a vacuum state without supplying the etchant gas, and the debris may be trapped by the magnetic field. Through such a configuration, the debris can be collected in the ion collection cylinder using the magnetic field while EUV light is being generated, and the debris can be suppressed from accumulating on the EUV collector mirror.

3.7.2 Configuration

Figure 14:
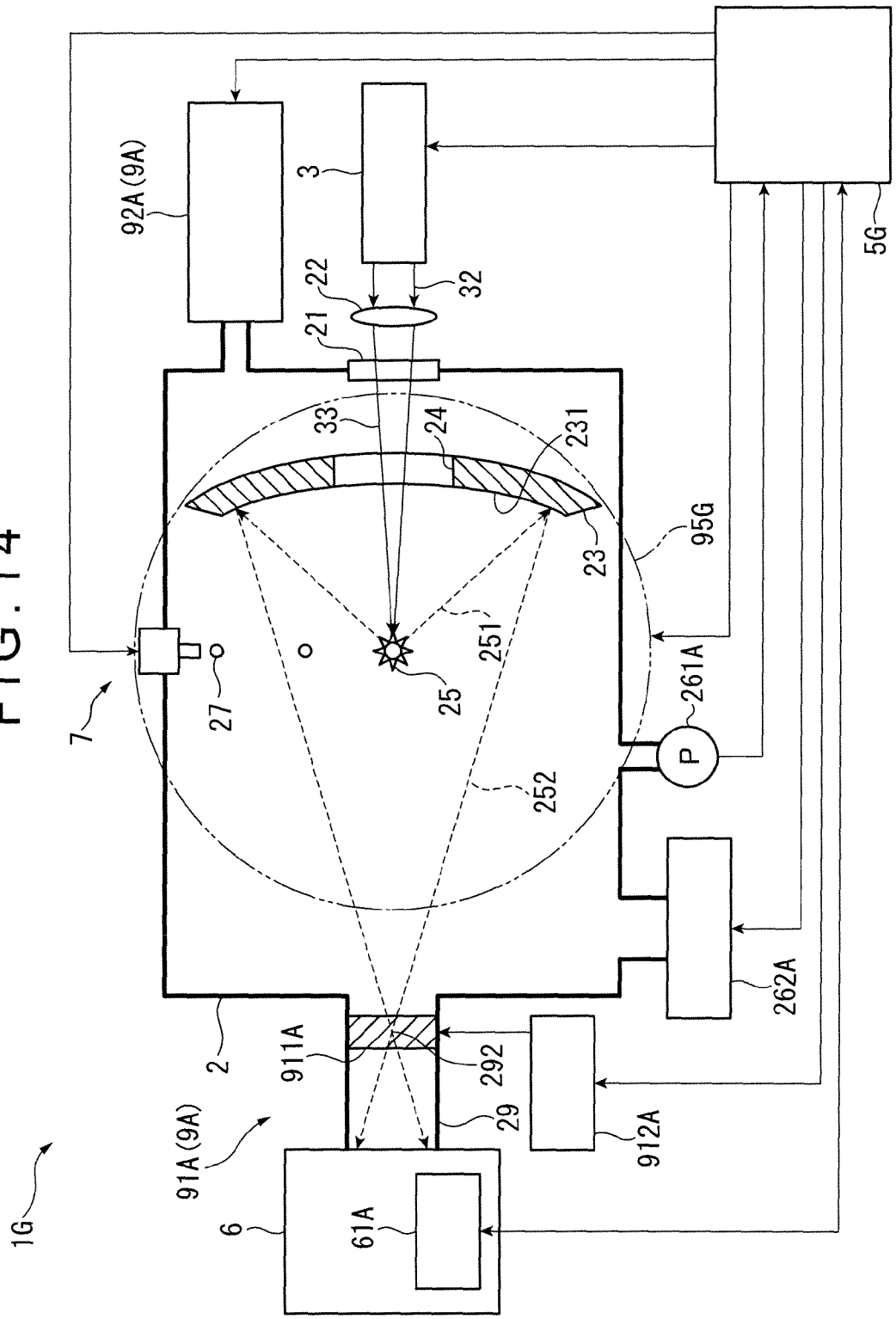
FIG. 14 illustrates a cross-sectional view of an EUV light generation apparatus including a cleaning function according to a seventh embodiment.
Figure 15:
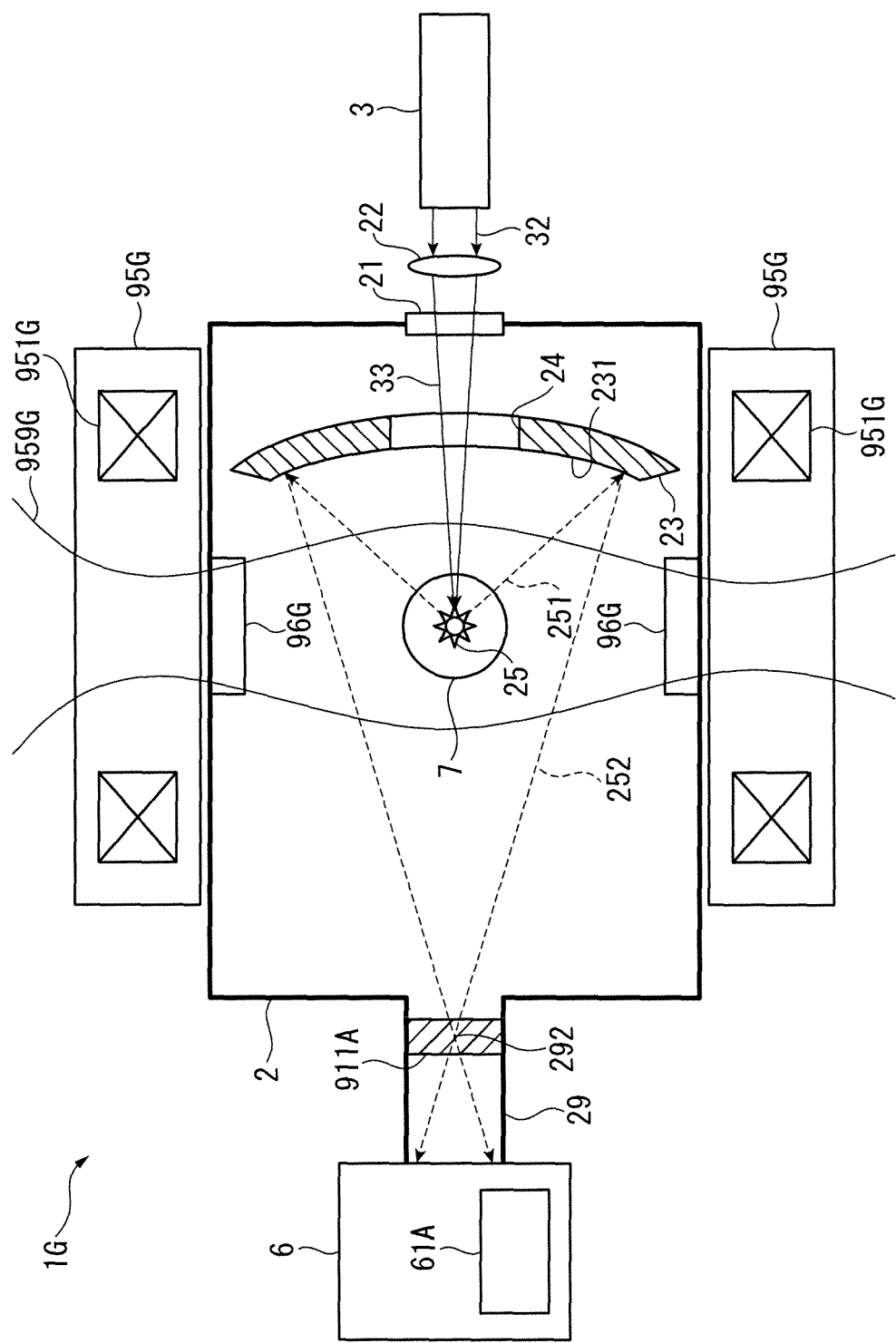
FIG. 15 schematically illustrates the cross-sectional configuration of the EUV light generation apparatus shown in FIG. 14, viewed as a cross-section orthogonal to the depiction in FIG. 14.

FIG. 14 illustrates a cross-sectional view of an EUV light generation apparatus including a cleaning function according to the seventh embodiment. FIG. 15 schematically illustrates the cross-sectional configuration of the EUV light generation apparatus shown in FIG. 14, viewed as a cross-section orthogonal to the depiction in FIG. 14.

As shown in FIGS. 14 and 15, an EUV light generation apparatus 1G may have the same configuration as the EUV light generation apparatus 1A of the first embodiment, aside from an EUV light generation control system 5G, magnetic field forming sections 95G, and ion collection cylinders 96G.

A pair of the magnetic field forming sections 95G disposed so that, for example, a center of lines of magnetism passes through the vicinity of the plasma generation site 25 may be disposed outside of the chamber 2. The magnetic field forming sections 95G may be superconducting magnets capable of forming a magnetic field of several T (teslas) inside the chamber 2. The magnetic field forming sections 95G may each include an electromagnet coil 951G. Each electromagnet coil 951G may be electrically connected to a power source (not shown). The power source may be electrically connected to the EUV light generation control system 5G.

A magnetic field 959G, the center of the lines of magnetism of which passes through the plasma generation site 25, can be formed by the power source (not shown) receiving a signal from the EUV light generation control system 5G and producing an electric current in the electromagnet coils 951G. Debris such as charged particles including tin ions produced by the plasma generated in the vicinity of the plasma generation site 25 can be trapped by the magnetic field 959G. The trapped charged particles can then form an ion flow by flowing so as to wrap around the lines of magnetism of the magnetic field 959G.

A pair of the ion collection cylinders 96G may be provided in a region within the chamber 2 where the lines of magnetism of the magnetic field 959G converges. The ion collection cylinders 96G may be formed as cylinders, with the faces thereof that face the plasma generation site 25 being open. The ion flow that flows along the magnetic field 959G can then be collected in one of the two ion collection cylinders 96G. Through this, much of the tin debris produced in the vicinity of the plasma generation site 25 can be collected by one of the two ion collection cylinders 96G. Note that the tin collected as debris can be reused as the target material.

3.7.3 Operation

Next, operations of the EUV light generation apparatus will be described.

The operations of the EUV light generation apparatus according to the seventh embodiment may be the same as those of the first to fourth embodiments, aside from supplying a current to electromagnet coils in an EUV light generation process. Note that the magnetic field forming sections 95G may be driven to form the magnetic field 959G during a debris etching process.

As described above, the debris may be etched using the etchant gas only when the EUV light 251 is not being generated, and may then be exhausted, whereas when the EUV light 251 is being generated, the interior of the chamber 2 may be exhausted to a vacuum state without supplying the etchant gas, and the debris may be trapped by the magnetic field 959G. Through such a configuration, the debris can be collected in the ion collection cylinders 96G using the magnetic field 959G, and the debris can be suppressed from accumulating on the reflective surface 231 of the EUV collector mirror 23.

Note that the same process as that performed in the sixth embodiment may be carried out as the debris accumulation amount detection process.

3.8 Eighth Embodiment

3.8.1 Overview

According to an eighth embodiment of the present disclosure, supplying an etchant gas to the interior of a chamber may include a reaction acceleration process of accelerating an etching reaction.

According to such a configuration, the debris etching rate can be increased, and the time from when the generation of EUV light is stopped to when the generation of EUV light is restarted can be reduced.

3.8.2 Configuration

Figure 16:
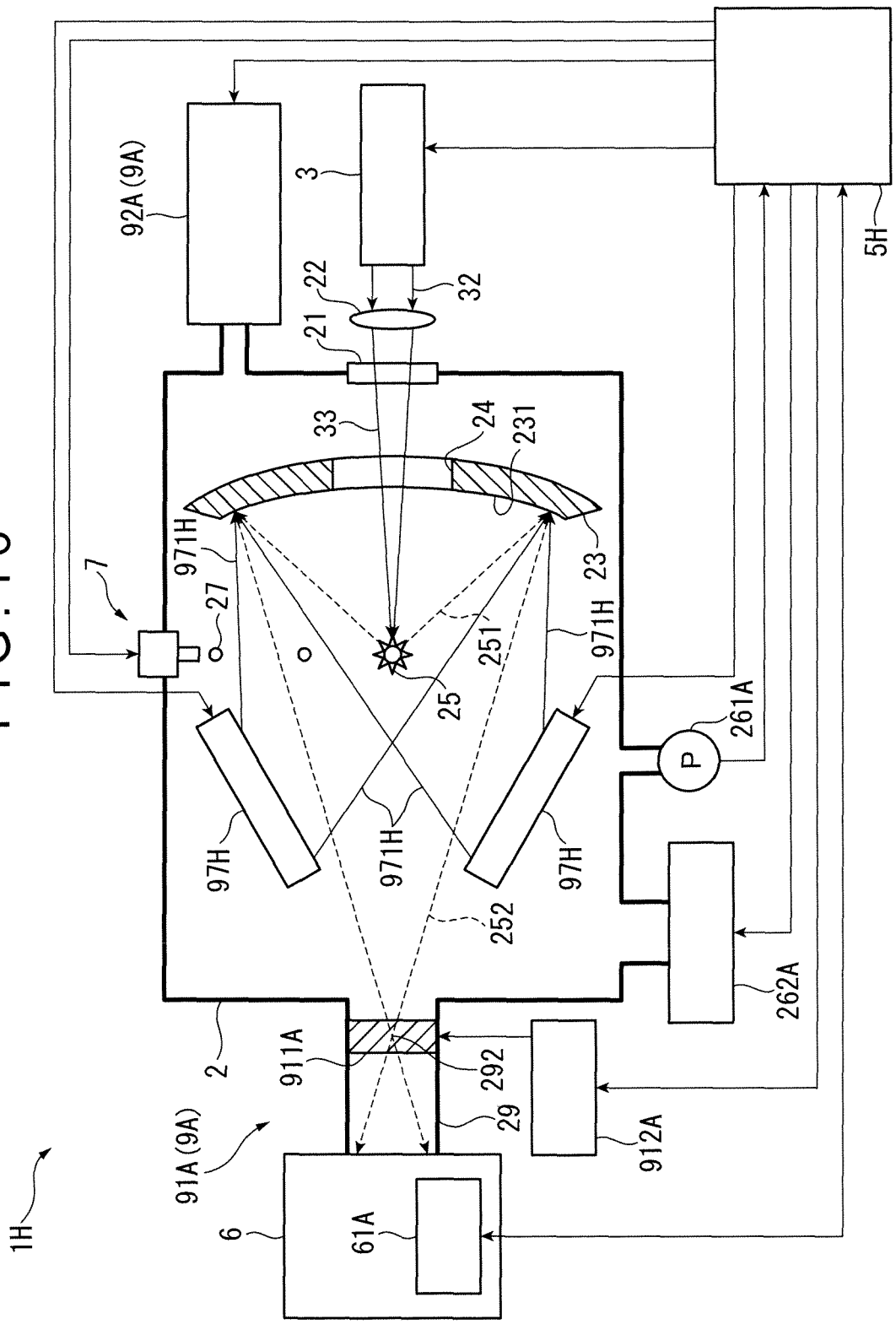
FIG. 16 illustrates the overall configuration of an EUV light generation apparatus including a cleaning function according to an eighth embodiment.

FIG. 16 illustrates the overall configuration of an EUV light generation apparatus including a cleaning function according to the eighth embodiment.

An EUV light generation apparatus 1H may, as shown in FIG. 16, have the same configuration as the EUV light generation apparatus 1A of the first embodiment, aside from an EUV light generation control system 5H and a DUV lamp 97H.

At least one DUV lamp 97H may be provided within the chamber 2. This DUV lamp 97H may be provided in a position that is outside an optical path of the EUV light 252. The DUV lamp 97H may be electrically connected to the EUV light generation control system 5H. Upon receiving a signal from the EUV light generation control system 5H, the DUV lamp 97H may generate DUV light 971H and radiate the DUV light 971H toward the reflective surface 231 of the EUV collector mirror 23.

Here, an etching reaction speed constant k can be dependent on an activation energy Ea and a temperature T, as indicated in the following Formula (1).

$$k = Ae^{-Ea/RT} \quad (1)$$

Based on this, by performing the reaction acceleration process that irradiates the etchant gas being supplied to the reflective surface 231 with the DUV light 971H, an activation energy or a temperature energy can be imparted on the etchant gas. Accordingly, the etching reaction speed can be accelerated, and the time until the debris etching ends can be reduced, as compared to a case where the reaction acceleration process is not performed.

Note that an excimer laser, an excimer lamp, or the like may be provided instead of the DUV lamp 97H, and the activation energy may be imparted on the etchant gas by irradiating the etchant gas with light therefrom. Likewise, a heater or the like that directly heats an optical element such as the EUV collector mirror 23 may be provided instead of the DUV lamp 97H, and the etching reaction speed may be accelerated by raising the temperature of the optical element.

Furthermore, hydrogen radicals may be generated by irradiating hydrogen gas with the DUV light 971H. According to such a configuration, tin that has accumulated as debris can be etched by generating a stannane gas as a result of the tin and the hydrogen radicals reacting.

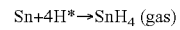

3.8.3 Operation

Next, operations of the EUV light generation apparatus will be described.

Figure 17:
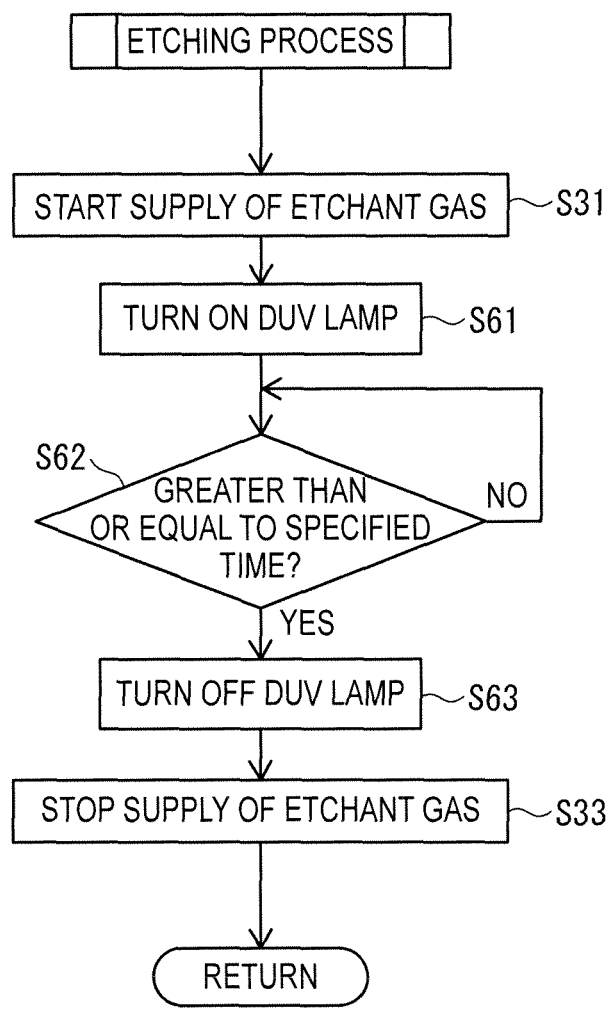
FIG. 17 is a flowchart illustrating an etching process.

FIG. 17 is a flowchart illustrating an etching process.

Note that the operations of the EUV light generation apparatus according to the eighth embodiment may be the same as those of the first to fifth embodiments, aside from the etching process.

The EUV light generation control system 5H may perform the processes of step S1 to step S12 shown in FIG. 3. In the etching process of step S9, the EUV light generation control system 5H may start the supply of the etchant gas to the interior of the chamber 2 while the exhaust apparatus 262A exhausts the interior of the chamber 2 (step S31), and may send a signal to the DUV lamp 97H and cause the DUV light 971H to be generated (step S61). The etching reaction speed can be accelerated by the etchant gas being irradiated with the radiated DUV light 971H.

Then, the EUV light generation control system 5H may determine whether or not a time for which the etchant gas is supplied has become greater than or equal to a specified time (step S62). Assuming the etching rate of the etchant gas on which the reaction acceleration process has been performed using the DUV light 971H is taken as E1 (nm/min) and an accumulation amount threshold is taken as T (nm), the specified time may be defined as T/E1 (min). In the case where the same etchant gas as in the first embodiment is used, the specified time can be shorter than the specified time in the first embodiment.

In the case where it has been determined in step S62 that the time is greater than or equal to the specified time, or in other words, that the debris etching is to be stopped, the EUV light generation control system 5H may extinguish the DUV lamp 97H (step S63) and stop the supply of the etchant gas (step S33).

On the other hand, in the case where it has been determined in step S62 that the time is not greater than or equal to the specified time, the EUV light generation control system 5H may once again carry out the process of step S62 after a pre-set amount of time has elapsed.

As described above, when supplying the etchant gas to the interior of the chamber 2, the etchant gas may be irradiated with the DUV light 971H as the reaction acceleration process that accelerates the etching reaction.

According to such a configuration, the debris etching rate can be increased, and the time from when the generation of the EUV light 251 is stopped to when the generation of the EUV light 251 is restarted can be reduced.

Although in the eighth embodiment, the supply of the etchant gas is stopped using the supply time of the etchant gas as a reference, it should be noted that the configuration of the sixth embodiment may further be provided and the supply of the etchant gas may be stopped using a result of a measurement performed by a debris sensor as a reference in the same manner as in the etching process of the sixth embodiment.

Figure 18:
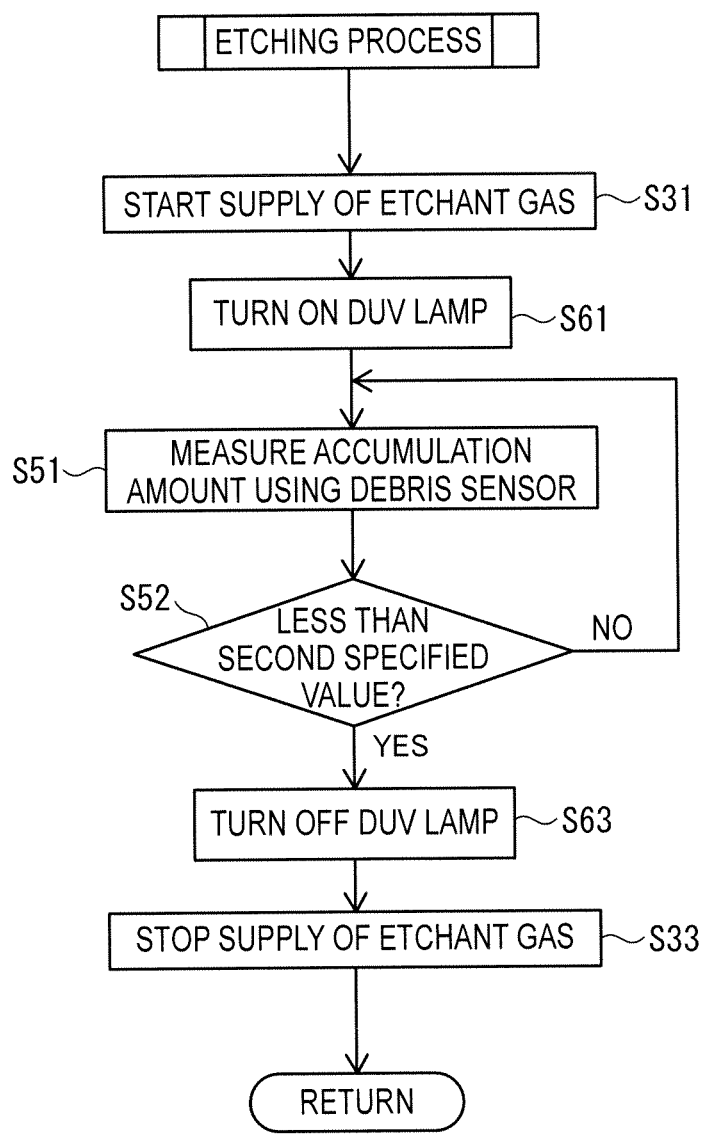
FIG. 18 is a flowchart illustrating an etching process according to a variation on the eighth embodiment.

Specifically, the EUV light generation control system 5H may perform the processes of step S51 and step S52 after the processes of step S31 and step S61, as shown in FIG. 18. The EUV light generation control system 5H may then perform the processes of step S63 and step S33.

3.9 Ninth Embodiment

3.9.1 Overview

According to a ninth embodiment of the present disclosure, supplying an etchant gas into a chamber may include a process for supplying the etchant gas along a reflective surface of an optical element.

According to such a configuration, the debris etching rate can be increased by increasing the flux of the etchant gas, and the time from when the generation of EUV light is stopped to when the generation of EUV light is restarted can be reduced. Here, "flux" may be an amount of etchant gas that passes over a unit of surface area on a plane perpendicular to the reflective surface, per unit of time.

3.9.2 Configuration

Figure 19:
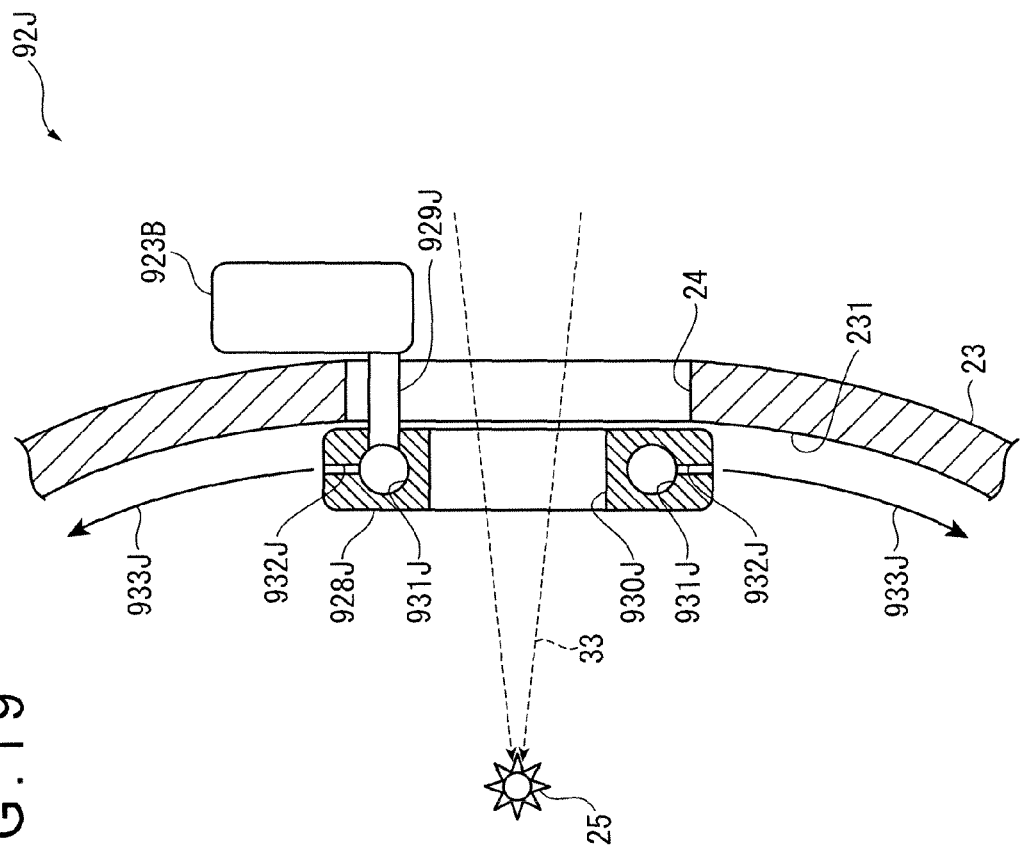
FIG. 19 illustrates the overall configuration of an etchant gas supply section according to a ninth embodiment.

FIG. 19 illustrates the overall configuration of an etchant gas supply section according to the ninth embodiment.

As shown in FIG. 19, an etchant gas supply section 92J may include the hydrogen radical generation section 923B, a nozzle 928J, and a linking pipe 929J. As in the second embodiment, the hydrogen radical generation section 923B may be linked to the hydrogen tank 921B via the hydrogen gas supply pipe 922B, and may generate hydrogen radicals using the hydrogen gas supplied by the hydrogen tank 921B.

The nozzle 928J may be formed in a circular ring shape having a through-hole 930J provided in the center thereof. The through-hole 930J may be smaller than the through-hole 24 of the EUV collector mirror 23. The nozzle 928J may be provided so that the center of the through-hole 930J is located coaxially with the center of the through-hole 24 on the side of the EUV collector mirror 23 where the plasma generation site 25 is located. By disposing the nozzle 928J in this manner, the pulse laser beam 33 can reach the plasma generation site 25 without being blocked by the nozzle 928J.

The nozzle 928J may be provided with a gas flow channel 931J that is continuous in a circumferential direction thereof. Furthermore, a slit 932J that enables an outer circumferential surface of the nozzle 928J to communicate with the gas flow channel 931J may be provided in the nozzle 928J. The slit 932J may be provided so as to continue across the entire circumference of the nozzle 928J, or may be provided discontinuously.

The linking pipe 929J may be provided so as to supply hydrogen radicals generated by the hydrogen radical generation section 923B to the gas flow channel 931J.

3.9.3 Operation

Next, operations of the EUV light generation apparatus will be described.

Note that the operations of the EUV light generation apparatus according to the ninth embodiment may be the same as those of the first to eighth embodiments, aside from an etchant gas supply process.

When supplying the etchant gas, an EUV light generation control system (not shown) may generate hydrogen radicals using the hydrogen radical generation section 923B. The hydrogen radicals can be supplied along the reflective surface 231 as an etchant gas 933J. At this time, if the slit 932J is provided continuously along the entire circumference of the nozzle 928J, the etchant gas 933J can be supplied to the entire surface of the reflective surface 231.

As described above, the etchant gas supply section 92J supplies the etchant gas 933J along the reflective surface 231, and thus the etching rate can be increased by increasing the flux of the etchant gas 933J, and the time from when the generation of EUV light is stopped to when the generation of EUV light is restarted can be reduced.

Note that the etchant gas 933J may be supplied toward the center of the EUV collector mirror 23 from the outer periphery thereof. Meanwhile, in the case where the EUV collector mirror 23 is provided with a through-hole aside from the through-hole 24, the nozzle 928J may be provided in that through-hole on the side where the plasma generation site 25 is located, and the etchant gas 933J may be supplied along the reflective surface 231.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular ones of the embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A cleaning method for an EUV light generation apparatus that includes a chamber in which EUV light is generated by introducing a laser beam, a connection portion configured to allow an interior of the chamber and an interior of an exposure apparatus to communicate, a target supply apparatus configured to supply a target material to a plasma generation site in the interior of the chamber, an EUV collector mirror having a reflective surface that reflects and collects EUV light generated by irradiating the target material with the laser beam at the plasma generation site and a through-hole that is formed at the center of the EUV collector mirror, and an exhaust apparatus configured to exhaust the interior of the chamber, the laser beam traveling through the through-hole toward the plasma generation site, the method comprising:

closing the connection portion so that the interior of the chamber and the interior of the exposure apparatus do not communicate when the EUV light is not being generated;

supplying an etchant gas for etching debris that has accumulated on the reflective surface of the EUV collector mirror to the interior of the chamber in a state where the connection portion is closed;

exhausting the interior of the chamber using the exhaust apparatus while supplying the etchant gas, measuring an amount of the debris that has accumulated in a circumferential edge area of the through-hole on the reflective surface that is closest to the plasma generation site when the EUV light is being generated, when it is determined that the amount of the accumulated debris is greater than or equal to a threshold, sending an etching mode signal requesting the start of etching;

in response to the etching mode signal, stopping an exposure operation performed by the exposure apparatus; and sending an etching mode enabling signal when the exposure operation is stopped, wherein, after stopping a generation of the EUV light when the etching mode enabling signal is received, the closing of the connection portion, the supplying of the etchant gas, and the exhausting of the interior of the chamber are performed.

2. The cleaning method for an EUV light generation apparatus according to claim 1, wherein the amount of the debris is determined based on a discharge pulse number and an accumulation rate of the debris.

3. The cleaning method for an EUV light generation apparatus according to claim 1, wherein, in the supplying of an etchant gas, the supply of the etchant gas is stopped after the etchant gas is supplied for a predetermined time.

4. The cleaning method for an EUV light generation apparatus according to claim 1, further comprising:

after supplying the etchant gas, opening the connection portion.

5. The cleaning method for an EUV light generation apparatus according to claim 4, further comprising:

after opening the connection portion, sending an etching completion signal to the exposure apparatus.

6. The cleaning method for an EUV light generation apparatus according to claim 5, further comprising:

after sending the etching completion signal, judging whether or not the generation of the EUV light is re-started.

* * * * *